United States Patent
Winter et al.

(10) Patent No.: US 11,015,241 B2
(45) Date of Patent: May 25, 2021

(54) REACTION OF DIAZADIENE COMPLEXES WITH AMINES

(71) Applicant: WAYNE STATE UNIVERSITY, Detroit, MI (US)

(72) Inventors: Charles H. Winter, Bloomfield Hills, MI (US); Marissa Marie Kerrigan, Berkley, MI (US)

(73) Assignee: WAYNE STATE UNIVERSITY, Detroit, MI (US)

( * ) Notice: Subject to any disclaimer, the term of this patent is extended or adjusted under 35 U.S.C. 154(b) by 159 days.

(21) Appl. No.: 16/307,608

(22) PCT Filed: Jun. 6, 2017

(86) PCT No.: PCT/US2017/036069
§ 371 (c)(1),
(2) Date: Dec. 6, 2018

(87) PCT Pub. No.: WO2017/214088
PCT Pub. Date: Dec. 14, 2017

(65) Prior Publication Data
US 2019/0301010 A1    Oct. 3, 2019

Related U.S. Application Data

(60) Provisional application No. 62/345,937, filed on Jun. 6, 2016.

(51) Int. Cl.
*C23C 16/16*    (2006.01)
*C23C 16/18*    (2006.01)
(Continued)

(52) U.S. Cl.
CPC ........ *C23C 16/18* (2013.01); *C23C 16/45553* (2013.01); *C07F 15/045* (2013.01); *C07F 15/065* (2013.01)

(58) Field of Classification Search
CPC . C23C 16/18; C23C 16/45553; C07F 15/045; C07F 15/065
See application file for complete search history.

(56) References Cited

U.S. PATENT DOCUMENTS 7,041,609 B2    5/2006    Vaartstra
7,442,407 B2    10/2008    Reuter et al.
(Continued)

FOREIGN PATENT DOCUMENTS

CN    101981226 A    2/2001
CN    1688742 A    10/2005
(Continued)

OTHER PUBLICATIONS

Lorenz, Volker, et al., "Diazadiene Complexes of the Heavy Alkaline-Earth Metals Strontium and Barium: Structures and Reactivity". Organometallics 2013, 32, pp. 4636-4642. dx.doi.org/10.1021/om400622d.*
(Continued)

*Primary Examiner* — Bret P Chen
(74) *Attorney, Agent, or Firm* — Brooks Kushman P.C.

(57) ABSTRACT

A method of forming a thin film on a substrate which includes a step of reacting a precursor compound with a Lewis base. The precursor compound has a transition metal and one or more alkyl-1,3-diazabutadiene ligands is provided.

32 Claims, 27 Drawing Sheets

(51) Int. Cl.
  *C23C 16/455* (2006.01)
  *C07F 15/04* (2006.01)
  *C07F 15/06* (2006.01)

(56) References Cited

U.S. PATENT DOCUMENTS

| | | | |
|---|---|---|---|
| 7,897,259 B1* | 3/2011 | Lococq | C03C 17/2453 428/426 |
| 8,092,721 B2 | 1/2012 | Gatineau et al. | |
| 9,349,637 B2 | 5/2016 | Na et al. | |
| 9,353,437 B2 | 5/2016 | Han | |
| 2009/0042041 A1 | 2/2009 | Grushin | |
| 2013/0164456 A1* | 6/2013 | Winter | B05D 3/107 427/535 |
| 2013/0330473 A1 | 12/2013 | Winter et al. | |
| 2014/0102365 A1 | 4/2014 | Anthis et al. | |
| 2014/0242298 A1 | 8/2014 | Lansalot-Matras et al. | |
| 2014/0363575 A1 | 12/2014 | Thompson et al. | |
| 2015/0105573 A1 | 4/2015 | Romero | |
| 2015/0247240 A1* | 9/2015 | Winter | C07F 19/00 427/255.28 |
| 2016/0152650 A1* | 6/2016 | Winter | C07F 15/045 427/255.28 |

FOREIGN PATENT DOCUMENTS

| | | |
|---|---|---|
| CN | 1896079 A | 1/2007 |
| CN | 103298971 A | 9/2013 |
| CN | 105390438 A | 3/2016 |
| CN | 105492656 A | 4/2016 |
| WO | 2014210512 A | 12/2014 |
| WO | 2015190871 | 12/2015 |

OTHER PUBLICATIONS

Klein, Philippe, et al., "Generation of Organozinc Reagents by Nickel Diazadiene Complex Catalyzed Zinc Insertion into Aryl Sulfonates". Chem. Eur. J. 2020, 26, pp. 176-180. DOI: 10.1002/chem.201904545.*

Yang, Xiuxiu, et al., "A low-valent dinuclear ruthenium diazadiene complex catalyzes the oxidation of dihydrogen and reversible hydrogenation of quinones". Chem. Sci., 2019, 10, pp. 1117-1125. DOI: 10.1039/c8sc02864h.*

Trifonov, A.A., et al., "Synthesis of bis(cyclopentadienyl)diazadiene complexes of ytterbium, An X-ray structural study of the CpzYb(g-q2:q2-But--N=CH--CH=N--But)Li(DME) complex". Russian Chemical Bulletin, vol. 43, No. 1, Jan. 1994, pp. 145-118.*

Tom Dieck, Heindirk, et al., "Bis(diazadien)metall(O)-Komplexe, IV. Nickel(O)-bis(chelate) mit aromatischen N-Substituenten/ Bis(diazadiene)metal(O) Complexes, IV. Nickel(O)-bis(chelates) with Aromatic N-Substituents". Zeitschrift für Naturforschung B, vol. 36: Issue 7, pp. 823-832.*

European Extended Search Report dated Nov. 19, 2019 for EP Appn. No. 17810821.3 filed Dec. 10, 2018.

International Search Report dated Sep. 11, 2017 for PCT/US2017/036069 filed Jun. 6, 2017, 13 pgs.

Office Action dated Sep. 17, 2020 for Chinese Appn. No. 201780047863.6 and English Translation, 16 pgs.

* cited by examiner

| Sputter Time (min) | Co2p | Pt4f | O1s | C1s | N1s | Si2p |
|---|---|---|---|---|---|---|
| 0.0 | 12.3 | 0.0 | 32.8 | 54.9 | 0.0 | 0.0 |
| 0.5 | 78.3 | 0.1 | 18.0 | 2.7 | 0.9 | 0.0 |
| 1.0 | 93.2 | 0.2 | 3.7 | 2.4 | 0.5 | 0.0 |
| 2.0 | 96.3 | 0.1 | 0.6 | 2.1 | 0.9 | 0.0 |
| 3.0 | 97.7 | 0.0 | 0.3 | 1.6 | 0.4 | 0.0 |
| 4.0 | 98.1 | 0.0 | 0.6 | 0.9 | 0.4 | 0.0 |
| 5.0 | 97.6 | 0.0 | 0.6 | 1.4 | 0.4 | 0.0 |
| 6.0 | 96.9 | 0.0 | 0.9 | 1.6 | 0.6 | 0.0 |
| 7.0 | 97.7 | 0.0 | 0.9 | 0.8 | 0.6 | 0.0 |
| 8.0 | 97.0 | 0.2 | 1.0 | 1.4 | 0.4 | 0.0 |
| 9.0 | 96.7 | 0.6 | 1.0 | 1.3 | 0.4 | 0.0 |
| 10.0 | 93.2 | 5.3 | 0.8 | 0.5 | 0.2 | 0.0 |
| 11.0 | 70.8 | 23.4 | 5.8 | 0.0 | 0.0 | 0.0 |
| 12.0 | 29.9 | 28.2 | 26.7 | 0.0 | 0.0 | 15.2 |
| 13.0 | 8.5 | 16.1 | 48.7 | 0.0 | 0.0 | 26.7 |
| 14.0 | 2.6 | 7.1 | 57.9 | 0.0 | 0.0 | 32.4 |
| 15.0 | 1.1 | 3.3 | 61.6 | 0.0 | 0.0 | 34.0 |

*FIG. 9B*

| Sputter Time (min) | Ni2p | Pt4d | O1s | C1s | N1s | Si2p |
|---|---|---|---|---|---|---|
| 0.0 | 30.2 | 1.8 | 33.2 | 33.9 | 0.9 | 0.0 |
| 0.5 | 86.5 | 11.2 | 0.0 | 1.9 | 0.4 | 0.0 |
| 1.0 | 80.6 | 10.9 | 4.0 | 1.5 | 0.3 | 2.6 |
| 1.5 | 64.3 | 20.3 | 8.2 | 1.3 | 0.0 | 5.8 |
| 2.0 | 34.3 | 37.5 | 14.5 | 0.0 | 0.0 | 13.7 |
| 2.5 | 10.2 | 39.1 | 30.5 | 0.0 | 0.0 | 20.1 |
| 3.0 | 2.1 | 25.1 | 43.6 | 0.0 | 0.0 | 29.2 |

| Sputter Time (min) | Ni2p | Pt4d | O1s | C1s | N1s | Si2p |
|---|---|---|---|---|---|---|
| 0.0 | 29.8 | 0.0 | 32.5 | 36.1 | 1.6 | 0.0 |
| 0.5 | 96.0 | 1.4 | 0.6 | 1.5 | 0.5 | 0.0 |
| 1.0 | 97.1 | 0.6 | 0.7 | 1.3 | 0.3 | 0.0 |
| 1.5 | 96.8 | 0.5 | 1.0 | 1.3 | 0.4 | 0.0 |
| 2.0 | 97.2 | 0.4 | 1.1 | 0.9 | 0.4 | 0.0 |
| 2.5 | 97.2 | 0.4 | 1.7 | 0.4 | 0.3 | 0.0 |
| 3.0 | 97.3 | 0.4 | 1.5 | 0.5 | 0.3 | 0.0 |
| 3.5 | 97.1 | 0.6 | 1.2 | 0.9 | 0.2 | 0.0 |
| 4.0 | 96.5 | 0.9 | 1.6 | 0.6 | 0.4 | 0.0 |
| 4.5 | 95.6 | 1.4 | 2.0 | 0.7 | 0.3 | 0.0 |
| 5.0 | 95.1 | 1.7 | 1.8 | 0.7 | 0.2 | 0.4 |
| 5.5 | 92.9 | 3.1 | 2.3 | 0.9 | 0.2 | 0.6 |
| 6.0 | 87.0 | 8.1 | 2.7 | 1.2 | 0.2 | 0.9 |
| 6.5 | 75.8 | 16.3 | 3.9 | 0.6 | 0.0 | 3.4 |
| 7.0 | 59.8 | 26.0 | 7.5 | 0.3 | 0.0 | 6.3 |
| 7.5 | 40.7 | 29.6 | 15.8 | 0.0 | 0.0 | 13.9 |
| 8.0 | 27.1 | 28.6 | 25.9 | 0.0 | 0.0 | 18.4 |
| 8.5 | 15.2 | 24.4 | 38.1 | 0.0 | 0.0 | 22.3 |
| 9.0 | 8.2 | 19.1 | 45.3 | 0.0 | 0.0 | 27.4 |
| 9.5 | 6.7 | 14.1 | 50.1 | 0.0 | 0.0 | 29.2 |
| 10.0 | 3.6 | 10.5 | 55.6 | 0.0 | 0.0 | 30.4 |

REACTION OF DIAZADIENE COMPLEXES WITH AMINES

CROSS-REFERENCE TO RELATED APPLICATIONS

This application is the U.S. national phase of PCT Appln. No. PCT/US2017/036069 filed Jun. 6, 2017, which claims the benefit of U.S. provisional application Ser. No. 62/345,937 filed Jun. 6, 2016, the disclosures of which are hereby incorporated in their entirety by reference herein.

STATEMENT REGARDING FEDERALLY SPONSORED RESEARCH OR DEVELOPMENT

This invention was made with government support under CHE-1212574 awarded by the National Science Foundation. The government has certain rights in the invention.

TECHNICAL FIELD

The present invention relates to methods of depositing metal layers on a substrate.

BACKGROUND

The growth of thin films is a central step in the fabrication of many functional materials and devices. While film growth efforts have been traditionally directed toward films with thicknesses greater than 100 nm, recent trends in several areas are calling for the growth of films ranging in thickness from a few atomic layers up to tens of nanometers.

As a significant example of this trend, the semiconductor industry has mandated a continuous reduction in microelectronics feature sizes from 65 nm in 2006 to <10 nm in 2017. This push toward smaller feature sizes requires controlled growth of films as thin as 1 nm. In addition to film growth on two-dimensional substrates such as etched silicon (Si) wafers, there is an increasing call to apply film growth techniques to nanoscale three-dimensional substrates such as nanoparticles, nanowires, carbon nanotubes, and biomaterials such as viruses, proteins, and natural fibers. Films on these substrates can play protective, passivating, or other functional roles, or may reproduce the shape of interesting nanoscale entities. The coatings may be as thin as a few monolayers to achieve the desired properties.

Atomic layer deposition ("ALD") is a thin film deposition technique that addresses many of the current technological demands. In a typical ALD process, a substrate is contacted with a first chemical composition that modifies the substrate for a first predetermined period of time (a pulse). Such modification involves adsorption to the surface of the substrate, reaction with the surface of the substrate, or a combination of adsorption and reaction. A purging gas is introduced to remove any lingering first gaseous chemical composition in the vicinity of the substrate. A second gaseous chemical composition that reacts with the modified substrate surface is introduced for a second predetermined period of time into the vicinity of the substrate to form a portion of the thin film. A purging gas is subsequently introduced to remove any lingering second chemical composition in the vicinity of the substrate. These steps of contacting the substrate with the first chemical composition, purging, contacting the substrate with the second gaseous chemical composition, and purging are usually repeated a plurality of times until a film of desired thickness is coated onto the substrate. Although the prior art ALD processes work well, there is unfortunately only a limited number of chemical precursors having the requisite thermal stability, reactivity, and vapor pressure for ALD.

Accordingly, there is a need for thermally stable volatile precursors suitable for depositing thin films by atomic layer deposition.

SUMMARY

The present invention solves one or more problems in the prior art by providing in at least one embodiment, a method for depositing a coating (e.g., a thin film) on a surface of a substrate. The method includes a step of contacting the substrate with a vapor of a metal-containing compound to form a modified surface on the substrate. Characteristically, the metal-containing compound is described by formulae I:

$$M_m^n \left[ \begin{array}{c} R_2 \quad R_3 \\ \diagup\!\!\!\diagdown_p \\ R_1-N \quad N-R_1 \end{array} \right]_o \quad \text{I}$$

or radicals thereof;
wherein:
M is a transition metal, a group 1 metal, a group 2 metal, Zn, or Cd;
m is an integer;
n is the formal charge of M;
o is an integer such that the overall formal charge of the compound having formula I is 0;
p is the formal charge of the ligand within the brackets;
$R_1$ is $C_{1-12}$ alkyl, amine, $C_{6-18}$ aryl, or $Si(R_4)_3$;
$R_2$, $R_3$ are each independently H, $C_{1-10}$ alkyl, $C_{6-18}$ aryl, amino, $C_{1-12}$ alkylamino, or $C_{2-24}$ dialkylamino; and
$R_4$ is H, $C_{1-10}$ alkyl or $C_{6-18}$ aryl. The modified surface is contacted with a vapor of a Lewis base and in particular, a neutral Lewis base, to form at least a portion of the coating (e.g., a thin film) on the surface of the substrate.

In another embodiment, a method for forming a coating on a substrate is provided. The method includes a step of reacting a vapor of a metal-containing compound with a Lewis base and in particular, a neutral Lewis base and optionally molecular hydrogen to form a coating on a substrate, the metal-containing compound being described by formulae $$M_m^n \left[ \begin{array}{c} R_2 \quad R_3 \\ \diagup\!\!\!\diagdown_p \\ R_1-N \quad N-R_1 \end{array} \right]_o$$

or radicals thereof;
wherein:
M is a transition metal, a group 1 metal, a group 2 metal, Zn, or Cd;
m is an integer;
n is the formal charge of M;
o is an integer such that the overall formal charge of the compound having formula I is 0;
p is the formal charge of the ligand within the brackets;
$R_1$ is $C_{1-12}$ alkyl, amine, $C_{6-18}$ aryl, or $Si(R_4)_3$;
$R_2$, $R_3$ are each independently H, $C_{1-10}$ alkyl, $C_{6-18}$ aryl, amino, $C_{1-12}$ alkylamino, or $C_{2-24}$ dialkylamino; and $R_4$ is H, $C_{1-10}$ alkyl or $C_{6-18}$ aryl. Advantageously, the method of the present embodiment can be an ALD process or a CVD process.

BRIEF DESCRIPTION OF THE DRAWINGS

Exemplary embodiments of the present invention will become more fully understood from the detailed description and the accompanying drawings, wherein:

FIGS. 9A and 9B. A) XPS depth profile and B) elemental compositions of a ~100 nm thick cobalt film grown on platinum at 200° C., using $Co(^{tBu2}DAD)_2$ and tert-butyl amine.

DETAILED DESCRIPTION OF EXEMPLARY EMBODIMENTS

Figure 1:
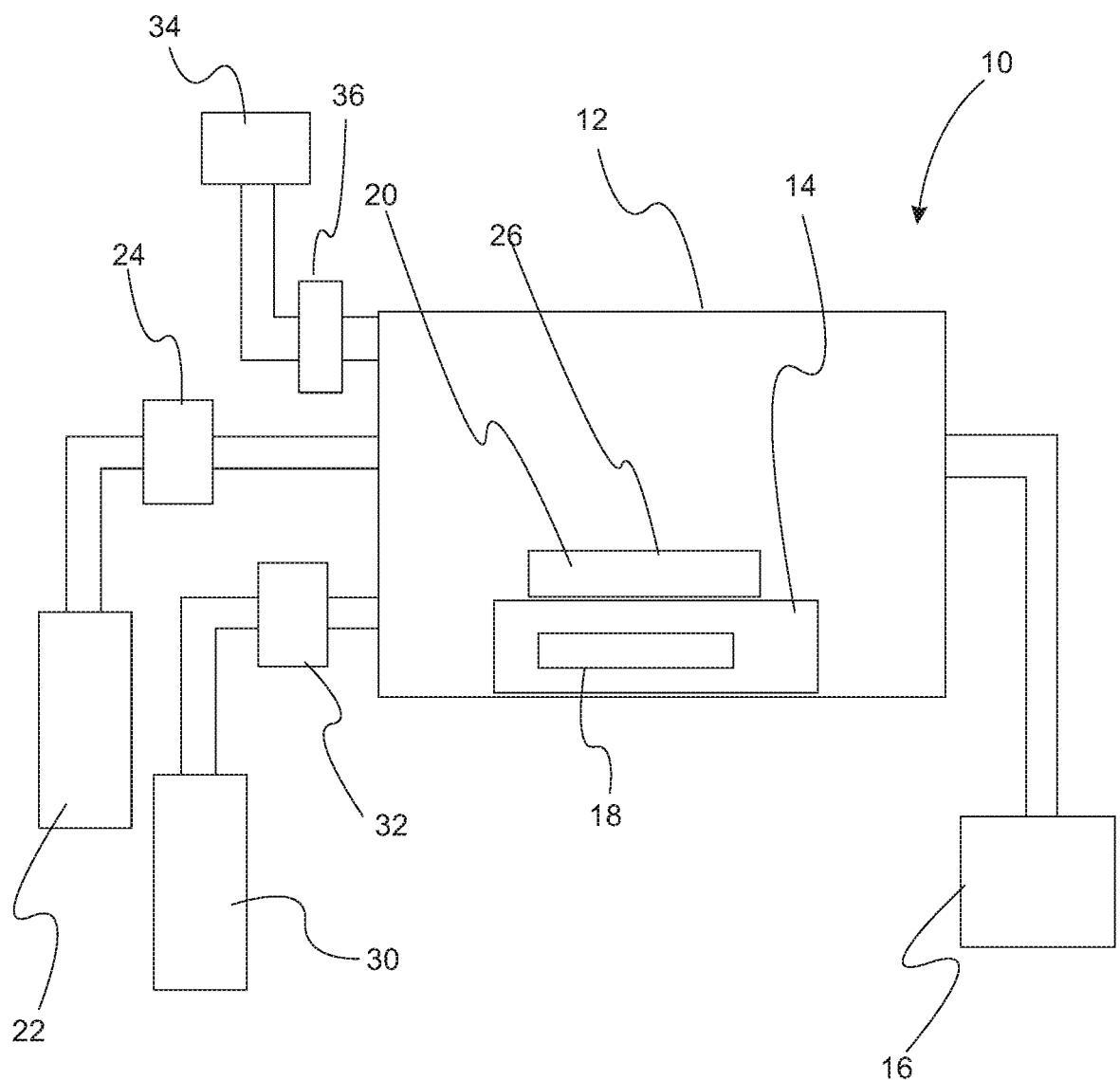
FIG. 1. Schematic illustration of an atomic layer deposition system.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: all R groups (e.g. $R_i$ where i is an integer) include hydrogen, alkyl, lower alkyl, $C_{1-6}$ alkyl, $C_{6-10}$ aryl, or $C_{6-10}$ heteroaryl; single letters (e.g., "n" or "o") are 0, 1, 2, 3, 4, or 5; percent, "parts of," and ratio values are by weight; the term "polymer" includes "oligomer," "copolymer," "terpolymer," and the like; molecular weights provided for any polymers refers to weight average molecular weight unless otherwise indicated; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

The terms "comprising", "consisting of", and "consisting essentially of" can be alternatively used. When one of these three terms is used, the presently disclosed and claimed subject matter can include the use of either of the other two terms.

The term "alkyl" refers to $C_{1-20}$ inclusive, linear (i.e., "straight-chain"), branched, saturated or at least partially and in some cases fully unsaturated (i.e., alkenyl and alkynyl) hydrocarbon chains, including for example, methyl, ethyl, n-propyl, isopropyl, butyl, isobutyl, tert-butyl, pentyl, hexyl, octyl, ethenyl, propenyl, butenyl, pentenyl, hexenyl, octenyl, butadienyl, propynyl, butynyl, pentynyl, hexynyl, heptynyl, and allenyl groups. "Branched" refers to an alkyl group in which a lower alkyl group, such as methyl, ethyl or propyl, is attached to a linear alkyl chain. "Lower alkyl" refers to an alkyl group having 1 to about 8 carbon atoms (i.e., a $C_{1-8}$ alkyl), e.g., 1, 2, 3, 4, 5, 6, 7, or 8 carbon atoms. "Higher alkyl" refers to an alkyl group having about 10 to about 20 carbon atoms, e.g., 10, 11, 12, 13, 14, 15, 16, 17, 18, 19, or 20 carbon atoms.

The term "transition metal" as used herein means an element whose atom has an incomplete d sub-shell, or which can give rise to cations with an incomplete d sub-shell.

The term "thin film" as used herein means a coating on a substrate having a thickness less than about 0.5 microns. Typically, a thin film as used herein is a coating with a thickness less than about 500 nm. However, for many applications, a thin film as deposited by ALD is less than about 100 nm.

The term "thick film" as used herein means a coating on a substrate having a thickness greater than about 0.5 microns. Typically, a thick film is deposited by a chemical vapor deposition process (CVD).

The term "coating" as used herein means a thin or thick film. Sometimes the term "film" will be used to refer to a coating.

In an embodiment of the present embodiment, a method for depositing a coating (e.g., a thin film or thick film) on a surface of a substrate is provided. The method includes a step of reacting a vapor of a metal-containing compound described by any of formulae I, II, III, and IV with a Lewis base and in particular, a neutral Lewis base to form a metal coating on the substrate. In a refinement, a reducing agent such as molecular hydrogen in added to the Lewis base. For example, in a chemical vapor deposition process (CVD) process molecular hydrogen is combined with the Lewis base prior and the metal-containing compound having formula 1 prior to and/or during reaction. In a variation, the reducing agent (e.g., molecular hydrogen) is present in an amount from about 0.1 to 20 weight percent of the combined weight of the reducing agent and the Lewis base. In some variations, the method is found to selectively deposit a metal layer on metal substrates or the metal component of heterogeneous substrates. For example, thin or thick film metal layers (e.g., Co) are deposited on metal substrates or components such as platinum, copper, ruthenium, and the like. The metal-containing compound described by any of formulae I, II, III, and IV have a metal atom bonded to a diazadienyl ligand(s). The metal coating includes metal atoms in the zero-oxidation state. Details for preparing and handing the diazadiene complexes of can be found in U.S. Pat. No. 9,255,327; the entire disclosure of which is hereby incorporated by reference. The coating can be a thick film or a thin film. In one refinement, the method is a CVD process. In another refinement, the method is an ALD process. The metal-containing compound (i.e., diazadiene complexes) includes a complex having formula I described as follows:

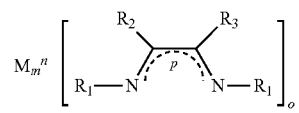

or radicals (e.g., diradicals) thereof;
wherein:
M is a transition metal, a group 1 metal, a group 2 metal, Zn, or Cd;
m is an integer (typically, m is 1);
n is the formal charge of M (typically, n is 0, 1+, 2+, or 3+);
o is an integer such that the overall formal charge of the compound having formula I is 0 (typically, o is 1, 2, or 3);
p is the formal charge of the ligand within the brackets (typically, 0, 1-, or 2-);
$R_1$ is $C_{1-12}$ alkyl, amine, $C_{6-18}$ aryl, or $Si(R_4)_3$;
$R_2$, $R_3$ are each independently H, $C_{1-10}$ alkyl, $C_{6-18}$ aryl, amino, $C_{1-12}$ alkylamino, or $C_{2-24}$ dialkylamino; and
$R_4$ is $C_{1-10}$ alkyl or $C_{6-18}$ aryl. In a refinement, $R_1$ is a lower alkyl.

The metal-containing compound having formula I will include various forms. For example, the metal-containing compound having formula I includes the complex having formula II described as follows:

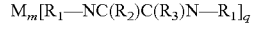

wherein
M is a transition metal, a group 1 metal, a group 2 metal, Zn, or Cd;
m is an integer (typically, m is 1);
q is an integer such that the overall formal charge of the compound having formula II is 0 (typically, q is 1, 2, or 3);

$R_1$ is $C_{1-12}$ alkyl, amine, $C_{6-18}$ aryl, or $Si(R_4)_3$;
$R_2$, $R_3$ are each independently H, $C_{1-10}$ alkyl, $C_{6-18}$ aryl, amino, $C_{1-12}$ alkylamino, or $C_{2-24}$ dialkylamino; and
$R_4$ is $C_{1-10}$ alkyl or $C_{6-18}$ aryl. In a refinement, $R_1$ is a lower alkyl.

In another refinement, the metal-containing compound having formula I includes the complex having formula III described as follows:

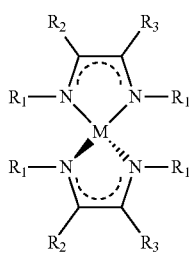

III fix per above
wherein
 M is a transition metal, a group 1 metal, a group 2 metal, Zn, or Cd;
 $R_1$ is $C_{1-12}$ alkyl, amine, $C_{6-18}$ aryl, or $Si(R_4)_3$;
 $R_2$, $R_3$ are each independently H, $C_{1-10}$ alkyl, $C_{6-18}$ aryl, amino, $C_{1-12}$ alkylamino, or $C_{2-24}$ dialkylamino; and
 $R_4$ is $C_{1-10}$ alkyl or $C_{6-18}$ aryl. In a refinement, $R_1$ is a lower alkyl.

In another refinement, the metal-containing compound having formula I includes the complex having formula IV described as follows:

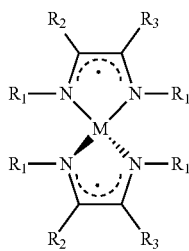

IV fix per above
wherein
 M is a transition metal, a group 1 metal, a group 2 metal, Zn, or Cd;
 $R_1$ is $C_{1-12}$ alkyl, amine, $C_{6-18}$ aryl, or $Si(R_4)_3$;
 $R_2$, $R_3$ are each independently H, $C_{1-10}$ alkyl, $C_{6-18}$ aryl, amino, $C_{1-12}$ alkylamino, or $C_{2-24}$ dialkylamino; and
 $R_4$ is $C_{1-10}$ alkyl or $C_{6-18}$ aryl. In a refinement, $R_1$ is a lower alkyl.

As set forth above, the methods call for a Lewis base, and in particular, a neutral Lewis base. In a refinement, the Lewis base is ammonia or alkyl amine described by the following formula:

wherein $R_5$, $R_6$ are each independently H or an alkyl. In a refinement, $R_5$ is H or a lower alkyl and $R_6$ is a lower alkyl. In a further refinement, $R_5$ is H or a $C_{1-6}$ alkyl and $R_6$ is a $C_{1-6}$ alkyl. It should be appreciated that $R_5$ and $R_6$ can be the same or different alkyl groups. Therefore, the alkyl amine can be a primary or secondary amine. Examples of specific primary or secondary alkyl amines that can be used include, but are not limited to, methyl amine, ethyl amine, n-propyl amine, isopropyl amine, n-butyl amine, sec-butyl amine, iso-butyl amine, tert-butyl amine, dimethyl amine, diethyl amine, di-n-propyl amine, di-iso-propyl amine, and the like. In other variations, the Lewis base is selected from the group consisting of CO, $R_7NC$ (isonitriles), phosphines $P(R_8)_3$, or organophosphites $P(OR_9)_3$, $R_7$, $R_8$, and $R_9$ are each independently H, $C_{1-6}$ alkyl or $C_{6-12}$ aryl.

In a variation, a method for depositing a coating (e.g., thin film or thick film) on a surface of a substrate using the metal-containing compound described by any of formulae I, II, III, and IV set forth above is provided. With reference to FIG. 1, ALD deposition system 10 includes reaction chamber 12, substrate holder 14, and vacuum pump 16. Typically, the substrate is heated via heater 18. Virtually any substrate may be coated as is well known by one skilled in the art of ALD. Surprisingly, the method of this variation is found to selectively deposit a metal layer on metal substrates or the metal component of heterogeneous substrates. For example, thin or thick metal layers (e.g., Co) are deposited on metal substrates or components such as platinum, copper, ruthenium, and the like. In contrast, metal layers are not deposited on non-metallic substrates or components such as silicon dioxide, carbon doped oxide (CDO), and the like. The method has a deposition cycle comprising contacting substrate 20 with a vapor of a metal-containing compound described by any of formulae I, II, III, and IV as set forth above. In a refinement, the compounds having formulae I, II, III, and IV are activated via a plasma prior to contacting the substrate. In particular, the vapor is introduced from precursor source 22 into reaction chamber 12 for a first predetermined pulse time. The first pulse time is controlled via control valve 24. At least a portion of the vapor of the metal-containing compound modifies (e.g., adsorbs or reacts with) substrate surface 26 to form a modified surface. The method further comprises contacting the modified surface with a vapor of Lewis base and in particular, a neutral Lewis base source 30 for a second predetermined pulse time. In a refinement, a reducing agent such as molecular hydrogen is combined with the Lewis base prior to introduction into reaction chamber 12 (i.e., prior to contacting the modified surface). Alternatively, the reducing agent can be added into the reaction chamber through a separate line. In a variation, the Lewis base (e.g., molecular hydrogen) is present in an amount from about 0.1 to 20 weight percent of the combined weight of the reducing agent and the Lewis base. The second predetermined pulse time is controlled via control valve 32. The alkyl amine causes the metal-containing compound to react and form at least a portion of the coating (e.g., thin film) on the surface of the substrate. The reduced pressure of chamber 12 is maintained by vacuum pump 16. In a variation of the present embodiment, the method further comprises removing at least a portion of the vapor of the metal containing compound that is lingering in the gas phase (i.e., has not adsorbed or reacted with the substrate) from the vicinity of the substrate before introducing the Lewis base and removing at least a portion of the vapor of the Lewis base from the vicinity of the substrate. The metal-containing compound and the Lewis base are removed in purging steps by introducing a purge gas from purge source 34 into reaction chamber 12 for a predetermined purge time. The purge time is controlled by control valve 36.

In another variation, the method further includes at least one additional deposition cycle comprising sequentially contacting the substrate with the vapor of a metal-containing compound (formulae I, II, III, and IV) and then the vapor of the Lewis base. In some refinements, the substrate is contacted for a plurality of additional deposition cycles. For example, the substrate may be contacted with from 1 to several thousand deposition cycles (e.g., 1 to 1000, 1 to 2000, 1 to 3000, 1 to 5000, 500 to 1000, 500 to 2000, 500 to 3000, 500 to 5000 deposition cycles) depending on the thickness of the coating desired.

During film formation by the method of the present embodiment, the substrate temperature will be at a temperature suitable to the properties of the chemical precursor(s) and film to be formed. In a refinement of the method, the substrate is set to a temperature from about 0 to 1000° C. In another refinement of the method, the substrate has a temperature from about 50 to 450° C. In another refinement of the method, the substrate has a temperature from about 100 to 250° C. In still another refinement of the method, the substrate has a temperature from about 150 to 400° C. In another refinement of the method, the substrate has a temperature from about 200 to 300° C.

Similarly, the pressure during film formation is set at a value suitable to the properties of the chemical precursors and film to be formed. In one refinement, the pressure is from about $10^{-6}$ Torr to about 760 Torr. In another refinement, the pressure is from about 5 to about 30 Torr. In still another refinement, the pressure is from about 1 to about 100 millitorr. In yet another refinement, the pressure is from about 1 to 20 millitorr.

Pulse times and purge times also depend on the properties of the chemical precursors and the geometric shape of the substrates. Thin film growth on flat substrates uses short pulse and purge times, but pulse and purge times in ALD growth on 3-dimensional substrates can be very long. Therefore, in one refinement, pulse times and purge times are each independently from about 0.0001 to 200 seconds. In another refinement, pulse and purge times are each independently from about 0.1 to about 10 seconds.

As set forth above with respect to a metal-containing compound described by formulae I, II, III, and IV, $R_1$ is $C_{1-12}$ alkyl, amine, $C_{1-12}$ alkylamino $C_{6-18}$ aryl, or $Si(R_4)_3$. In one refinement, $R_1$ is a lower alkyl. In a variation, $R_1$ is $C_{1-4}$ alkyl. Specific examples for $R_1$ include, but are not limited to, methyl, ethyl, n-propyl, isopropyl n-butyl, sec-butyl, isobutyl, tert-butyl, and the like. In a particularly useful refinement, $R_1$ is tert-butyl. In another variation, $R_1$ is $C_{6-10}$ aryl. In this refinement, specific examples for $R_1$ include, but are not limited to, phenyl, biphenyl, napthyl, and the like. In a further refinement, it should be appreciated that the definitions for $R_1$ include substituted variations of such groups. Examples of substituents include, but are not limited to, halogen, hydroxyl, $-NO_2$, and in the case of aryl, $C_{1-4}$ alkyl. These substituents are particularly relevant when $R_1$ is aryl.

As set forth above with respect to a metal-containing compounds described by formulae I, II, III, and IV, $R_2$, $R_3$ are each independently H, $C_{1-12}$ alkyl, $C_{1-12}$ alkylamino or $C_{6-18}$ aryl. In a variation, $R_2$, $R_3$ are each independently H or $C_{1-4}$ alkyl. In this refinement, specific examples for $R_2$, $R_3$ include, but are not limited to, methyl, ethyl, n-propyl, isopropyl n-butyl, sec-butyl, isobutyl, tert-butyl, and the like. It should also be appreciated that when either $R_2$ or $R_3$ is $C_{1-12}$ alkylamino or $C_{2-22}$ dialkylamino, the alkyl component is the same as set forth for when $R_2$ is H or a $C_{1-12}$ alkyl. Therefore, additional specific examples for $R_2$, $R_3$ include, but are not limited to, methylamino, ethylamino, propylamino, diethylamino, dimethylamino, dipropylamino, and the like. In another refinement, $R_2$, $R_3$ are each independently H or $C_{6-10}$ aryl. In this refinement, specific examples for $R_2$, $R_3$ include, but are not limited to, phenyl, biphenyl, napthyl, and the like. In a further refinement, it should be appreciated that the definitions for $R_2$, $R_3$ include substituted variations of such groups. Examples of substituents include, but are not limited to, halogen, hydroxyl, $-NO_2$, and in the case of aryl, $C_{1-4}$ alkyl.

In another variation of the metal-containing compounds described by formulae I, II, III, and IV, M is a metal in a 0, 1+, 2+, or 3+ oxidation state. Examples of useful transition metals for M include, but are not limited to, Cu, Ni, Co, Cr, Mn, Fe, W, Mo, Ti, Zr, Hf, Rf, V, Nb, Ta, Re, Ru, Rh, Ir, Pd, Pt, and Au. Particularly useful examples for M include, but are not limited to, Cr(II), Mn(II), Fe(II), Co(II), and Ni(II). In a refinement, M is a transition metal selected from groups 3-7 of the periodic table. M can also be Li, Na, K, Rb, Cs, Mg, Ca, Sr, Ba, Zn, Cd and the like.

The following examples illustrate the various embodiments of the present invention. Those skilled in the art will recognize many variations that are within the spirit of the present invention and scope of the claims.

Cobalt Metal Thin Films 1.1 Introduction

Figure 2:
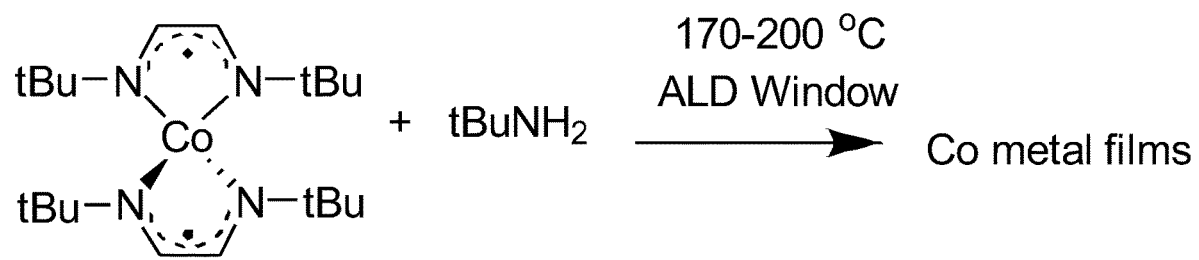
FIG. 2. General reaction scheme for the deposition of cobalt metal thin films from $Co(^{tBu2}DAD)_2$ and tert-butyl amine by thermal ALD.

The growth of metallic cobalt was demonstrated on a variety of substrates using $Co(^{tBu2}DAD)_2$ and tert-butyl amine as precursors (FIG. 2). When using tert-butyl amine, a growth rate of 0.98 Å/cycle was achieved in the ALD window of 170-200° C. The resultant films were continuous, featured high-purity metallic cobalt films, and exhibited low resistivity values when grown on metallic substrates.

Figure 3:
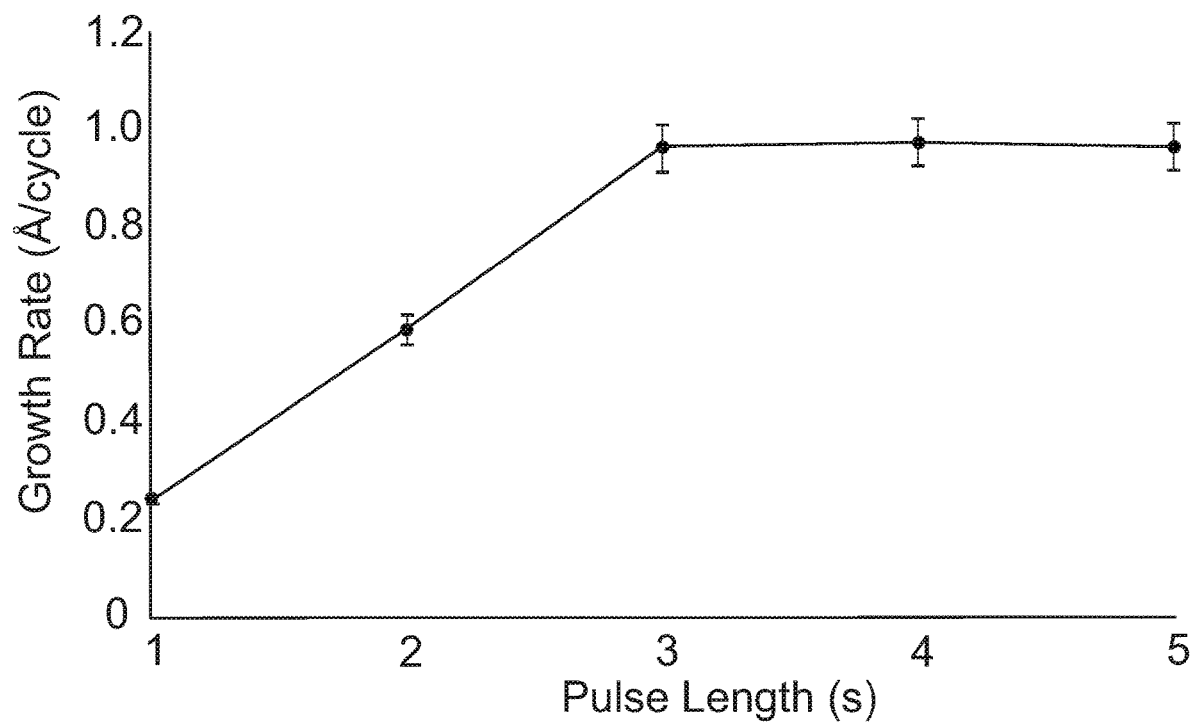
FIG. 3. Plot of growth rate of cobalt metal on platinum substrates versus pulse length of $Co(^{tBu2}DAD)_2$ after 200 cycles, using $Co(^{tBu2}DAD)_2$ and tert-butyl amine as precursors.
Figure 4:
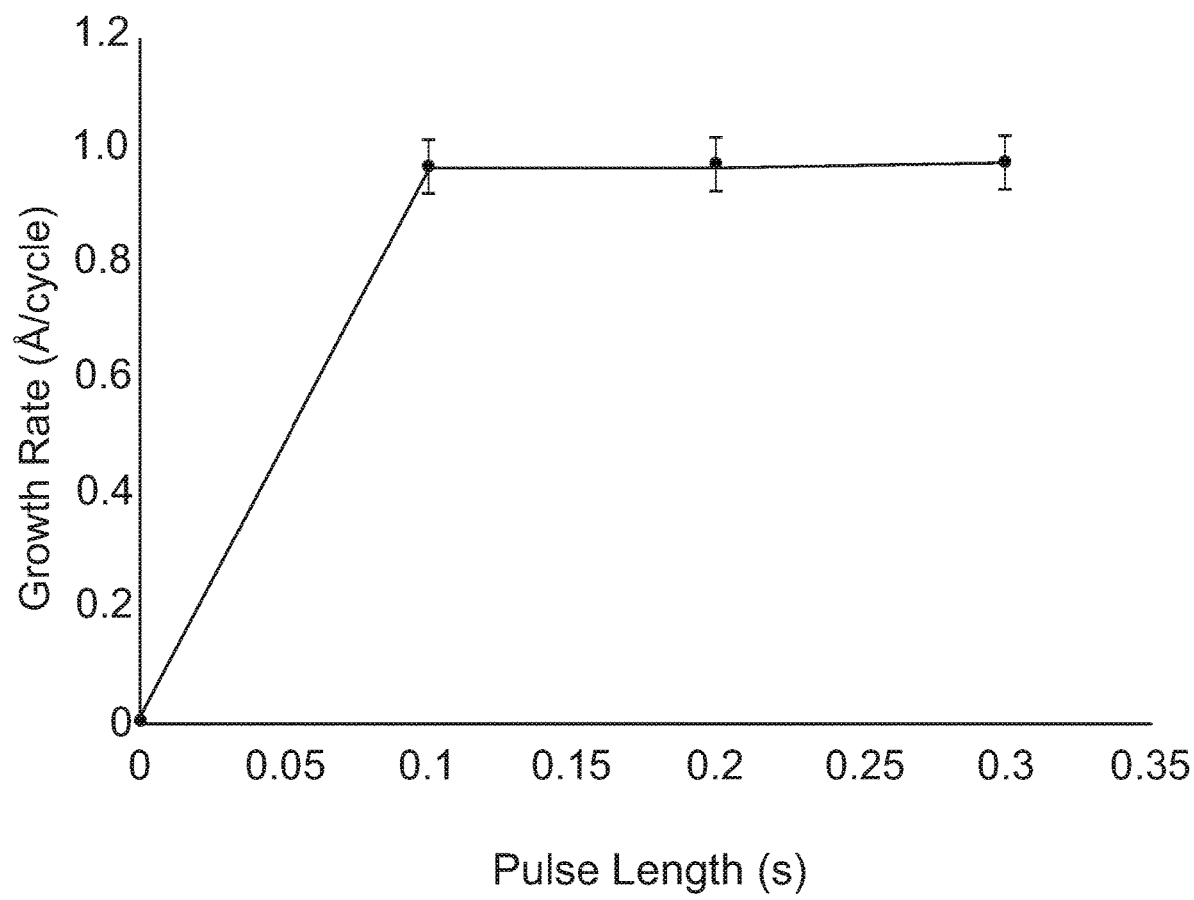
FIG. 4. Plot of growth rate of cobalt metal on platinum substrates versus pulse length of tert-butyl amine after 200 cycles, using $Co(^{tBu2}DAD)_2$ and tert-butyl amine as precursors.

1.2 Results and Discussion 1.1.1 Low Temperature ALD Study of Cobalt Metal from $Co(^{tBu2}DAD)_2$ and tert-butyl Amine Experiments to demonstrate ALD growth of metallic cobalt using $Co(^{tBu2}DAD)_2$ and tert-butyl amine were performed on platinum substrates. First, self-limiting growth was established by varying the pulse length of one co-reagent at a time while keeping all other conditions constant, then plotting the growth rate as a function of precursor pulse length. Experiments to evaluate $Co(^{tBu2}DAD)_2$ saturation used a pulsing sequence of $Co(^{tBu2}DAD)_2$ (varied), purge (10.0 s), tert-butyl amine (0.2 s), purge (10.0 s) for 200 cycles, at a deposition temperature of 200° C. Self-limited growth was observed after ≥3.0 s pulse lengths of $Co(^{tBu2}DAD)_2$, as evidenced by a constant growth rate of 0.98 Å/cycle (FIG. 3). Saturation of tert-butyl amine was determined by varying the pulse length of tert-butyl amine, keeping all other deposition parameters constant. These experiments used a pulsing sequence of $Co(^{tBu2}DAD)_2$ (4.0 s), purge (10.0 s), tert-butyl amine (varied), purge (10.0 s) for 200 cycles, at a deposition temperature of 200° C. Self-limited growth was observed after ≥0.1 s pulse lengths of tert-butyl amine, as evidenced by a constant growth rate of 0.98 Å/cycle (FIG. 4).

To assess temperature dependence, experiments to construct an ALD window were performed. Films were grown using a saturative pulsing sequence of $Co(^{tBu2}DAD)_2$ (4.0 s), purge (10.0 s), tert-butyl amine (0.1 s), purge (10.0 s) at temperatures within 160-220° C., each for 200 cycles. Due to the decomposition temperature of $Co(^{tBu2}DAD)_2$ (235° C.) higher temperatures were not evaluated. A constant growth rate of 0.98 Å/cycle was observed between 170-200°

Figure 5:
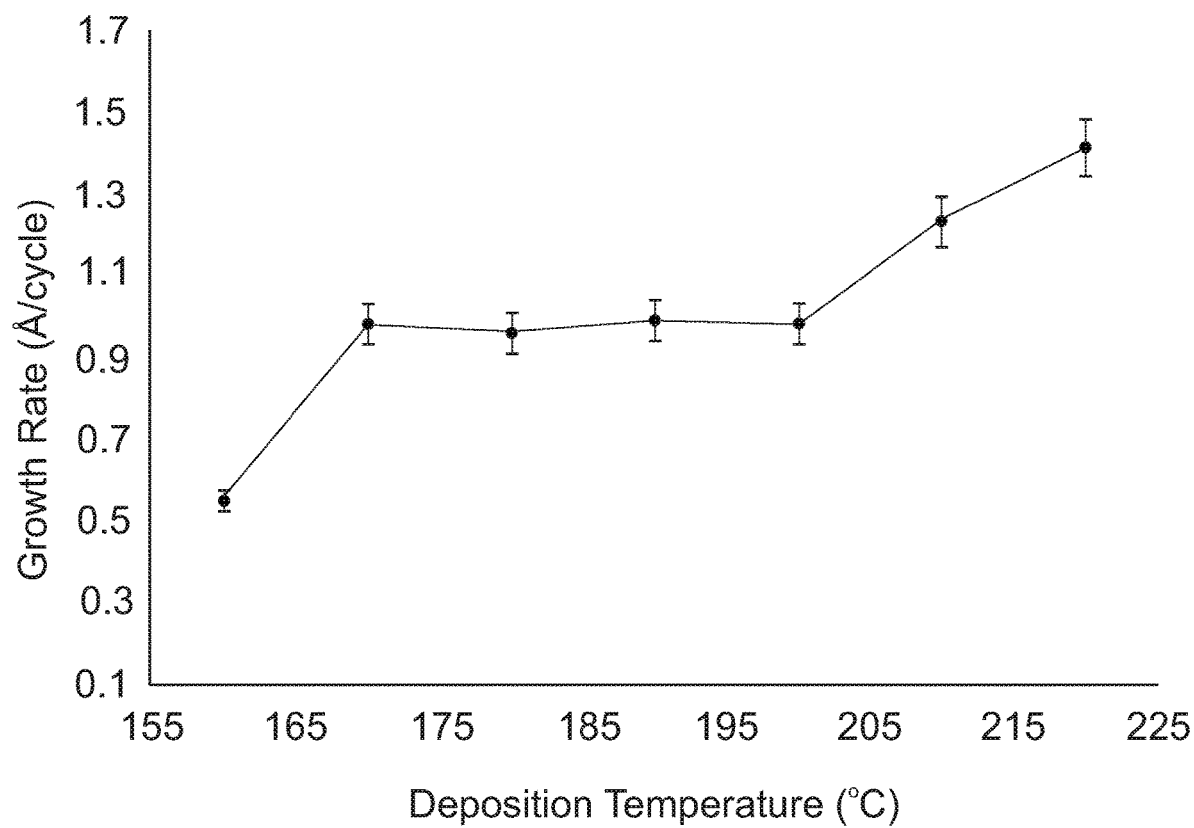
FIG. 5. Plot of growth rate versus deposition temperature for cobalt metal growth on platinum substrates after 200 cycles using $Co(^{tBu2}DAD)_2$ and tert-butyl amine.

C. for films deposited on platinum substrates (FIG. 5). Cross-sectional SEM images revealed uniform, continuous films deposited on platinum in the ALD window.

Figure 6:
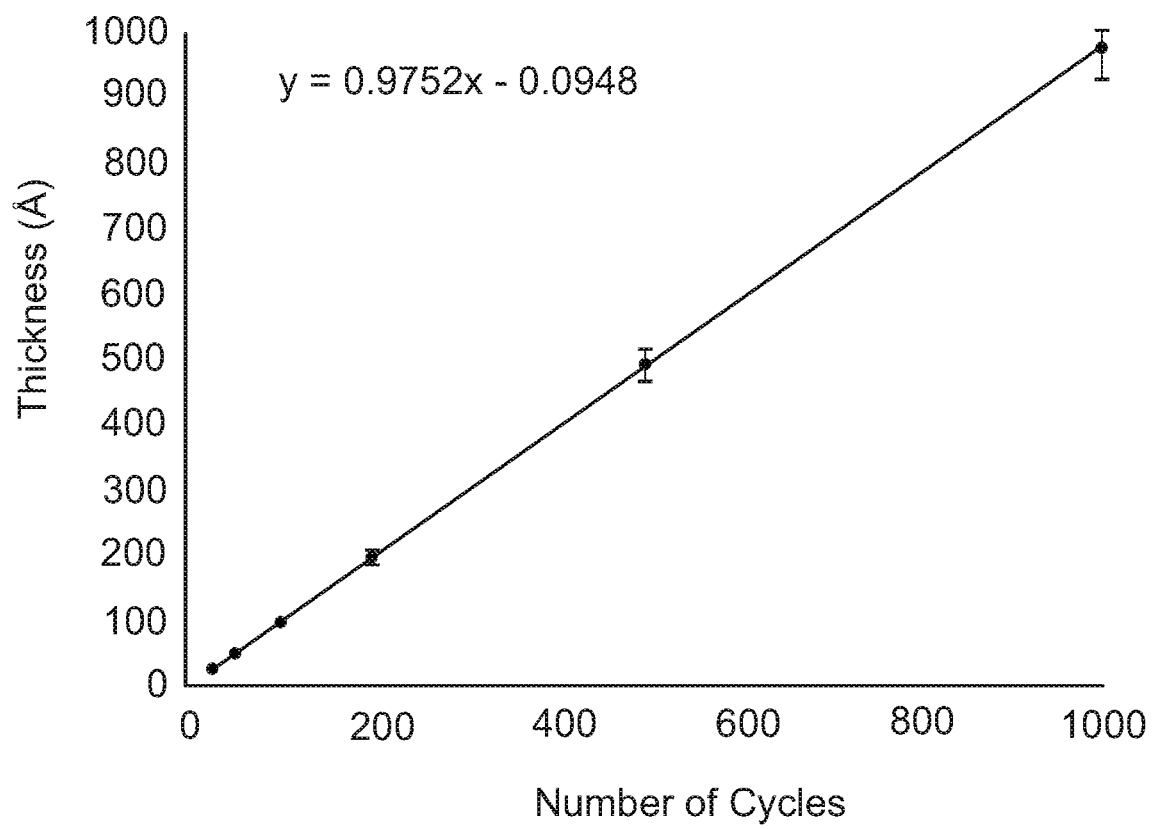
FIG. 6. Plot of thickness versus number of cycles for cobalt metal growth on platinum substrates at 200° C. using $Co(^{tBu2}DAD)_2$ and tert-butyl amine.

To evaluate the growth of this process as a function of number of ALD cycles, the same saturative dose pulsing sequence used for the ALD window determination was used, at a deposition temperature of 200° C., while varying the number of cycles. The resulting plot shows a slope of 0.98 Å/cycle on platinum from 25-1000 cycles (FIG. 6). The y-intercept of 0.095 is within experiment error of zero, indicating that as few as 25 cycles are needed to achieve normal ALD growth without a nucleation delay. Fewer than 25 deposition cycles were not explored, since the cross-sectional SEM measurements are limited by a minimum film thickness of ~2 nm.

Figure 7:
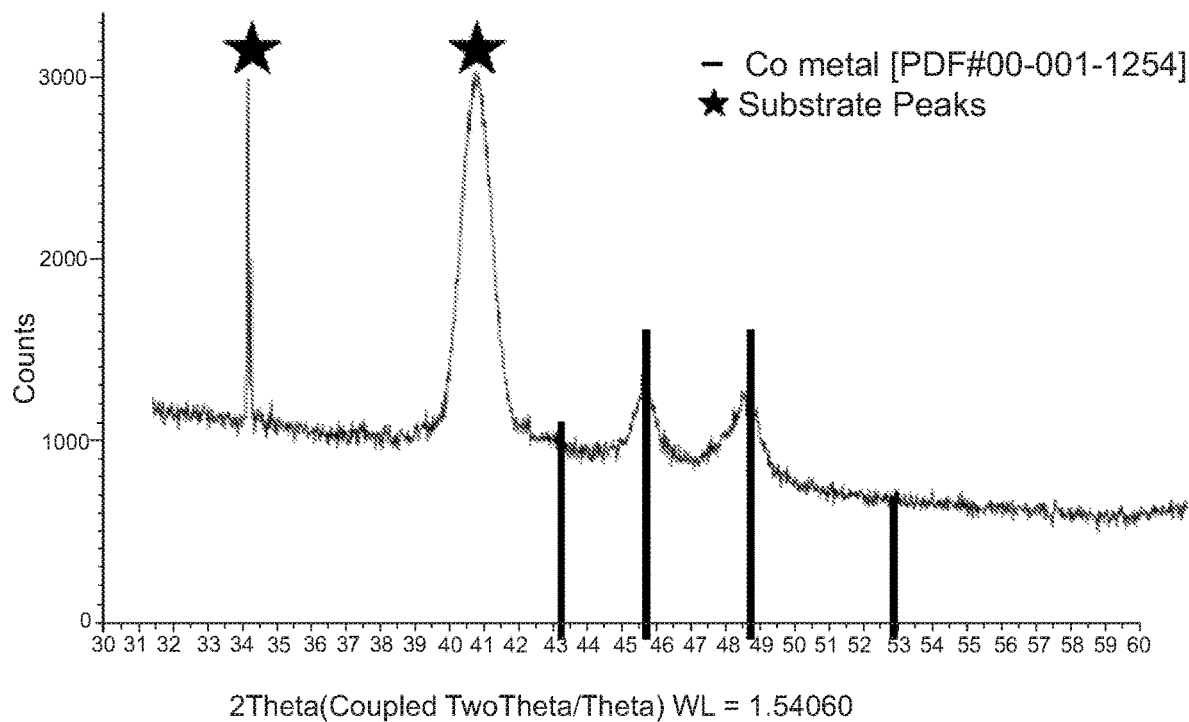
FIG. 7. X-ray diffraction pattern for ~50 nm thick cobalt metal film grown on a platinum substrate at 200° C. using $Co(^{tBu2}DAD)_2$ and tert-butyl amine.

1.1.2 Characterization of Films Deposited by ALD Using Co($^{tBu}$DAD)$_2$ and Tert-Butyl Amine XRD was performed on a ~50 nm cobalt film grown on a platinum substrate to assess the degree of crystallinity of the as-deposited film (FIG. 7). The XRD pattern displayed reflections consistent with that of crystalline cobalt metal (PDF #00-001-1254) with the remaining peaks consistent with that of the previously determined XRD pattern for the bare substrate.

AFM was performed to examine the surface topologies of films of different thicknesses (~10 nm, 100 cycles and ~100 nm, 1000 cycles) grown on platinum substrates. The uncoated platinum substrate has been previously measured to have an rms roughness value of 0.19 nm. (Kerrigan, M. M.; Klesko, J. P.; Rupich, S. M.; Dezelah, C. L.; Kanjolia, R. K.; Chabal, Y. J.; Winter, C. H. J. Chem. Phys. 2017, 146, 052813). The ~10 nm thick film had an rms roughness value of 0.22 nm over the full 5×5 μm$^2$ area, which corresponds to 2.2% of the total film thickness. The ~100 nm thick film had an rms roughness value of 3.07 nm over the full 5×5 μm$^2$ area, which corresponds to 3.07% of the total film thickness. These rms roughness values indicate that over a wide span of thicknesses, the as-deposited films from this process are extremely smooth.

Figure 8A:
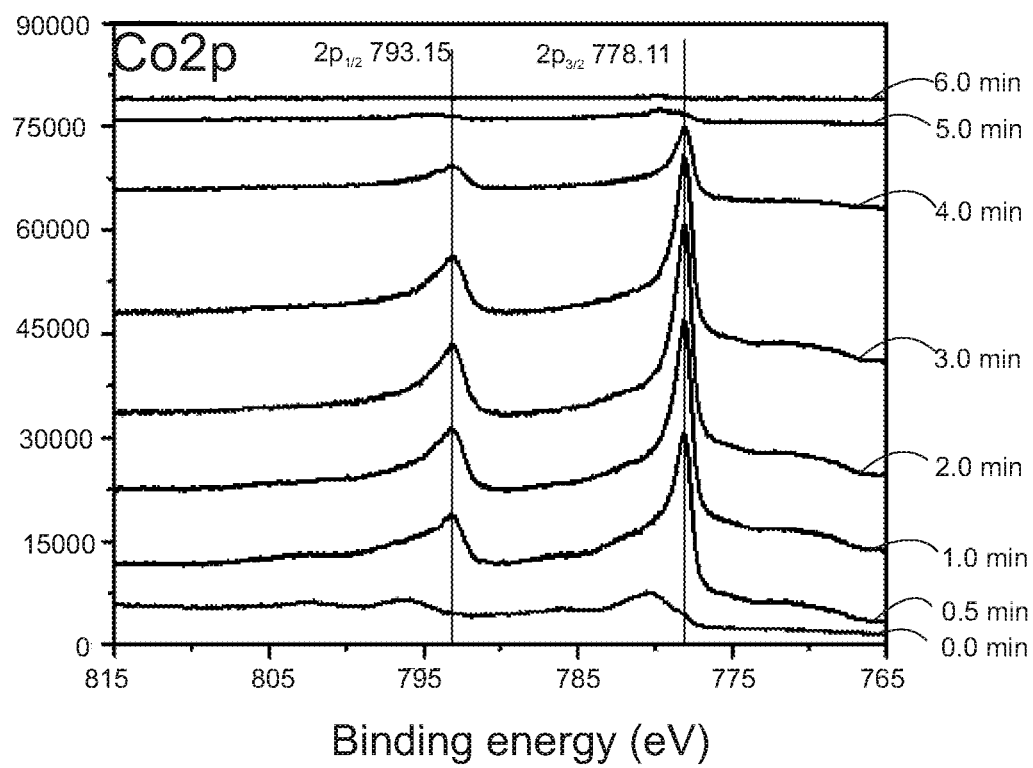
FIGS. 8A, 8B, and 8C. High-resolution XPS multiplex of cobalt 2p region of A) 50 nm and B) 100 nm thick cobalt film grown on platinum using $Co(^{tBu2}DAD)_2$ and tert-butyl amine; C) reference cobalt film.
Figure 8B:
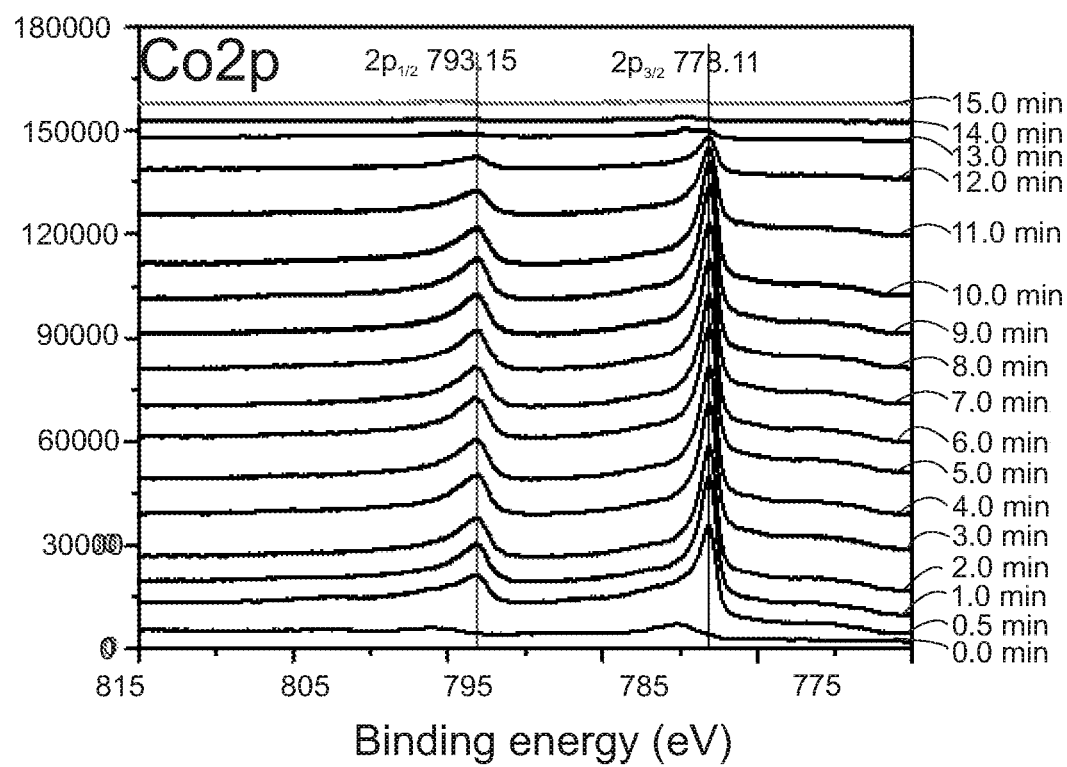
Figure 8C:
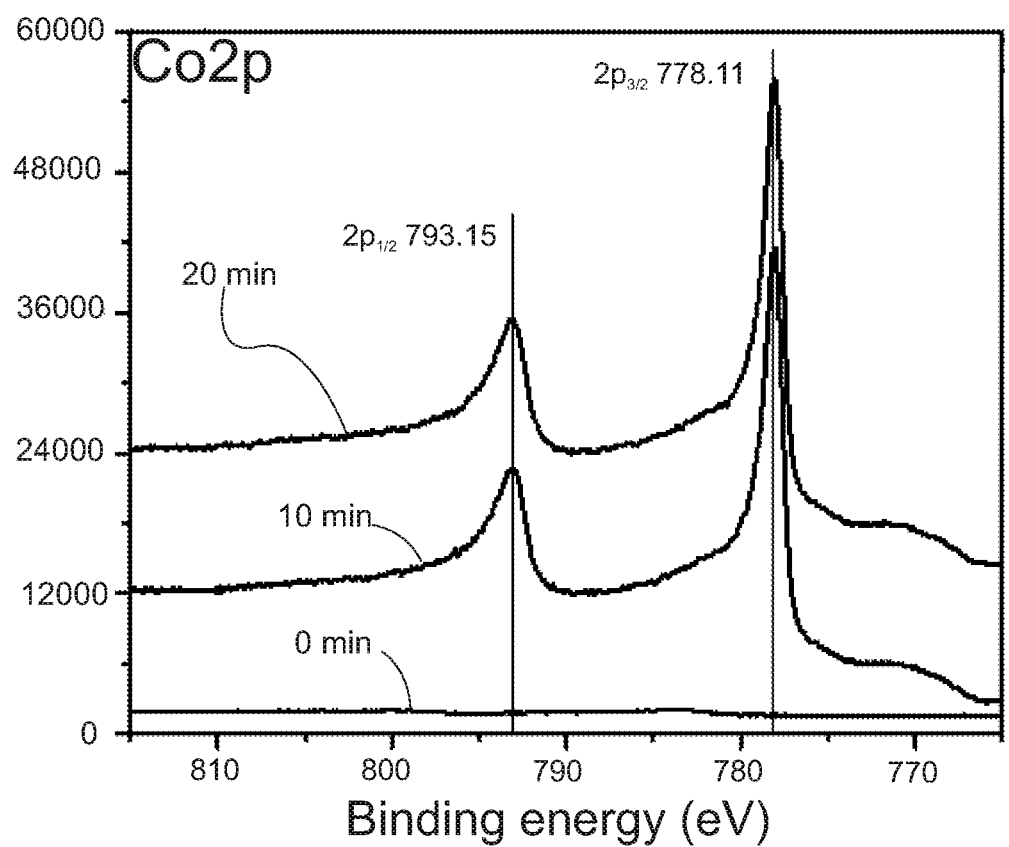
Figure 9A:
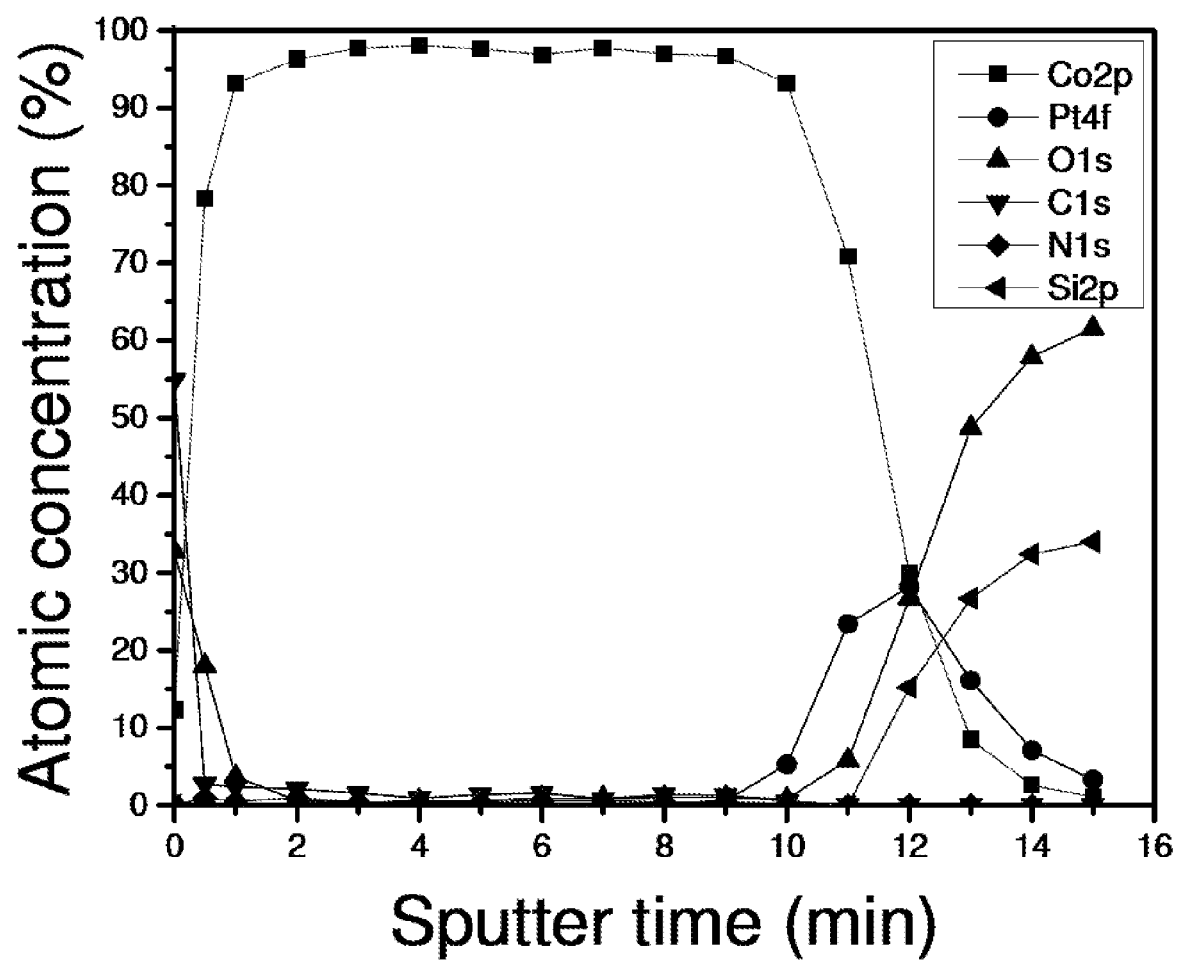

XPS was performed on samples deposited on platinum substrates at different deposition temperatures (170 and 200° C.) to assess the composition of the cobalt metal films grown over the span of the ALD window. A ~50 nm cobalt film (500 cycles) grown at 170° C. and a ~100 nm cobalt film (1000 cycles) grown at 200° C. were analyzed. Analysis of the high-resolution multiplex of the Co 2p core shell revealed binding energies which correspond to metallic cobalt (Co $2p_{3/2}$ 778.11 eV and Co $2p_{1/2}$ 793.15 eV) after as little as 0.5 minutes of sputtering, for both samples (FIG. 8A, B). These binding energies are consistent with values obtained from a cobalt metal standard (Co $2p_{3/2}$ 778.11 eV and Co $2p_{1/2}$ 793.15 eV) (FIG. 8C). XPS depth profiling was performed to assess the elemental composition of the films, which revealed >98% pure cobalt metal upon sputtering, with trace impurities (<1% each) of carbon, oxygen, and nitrogen (FIG. 9). After 10 minutes of sputtering, of platinum and cobalt is observed, which may correspond to the formation of an interfacial alloy.

1.2.3 Description of Growth of Cobalt Metal on Metallic Substrates

Figure 10:
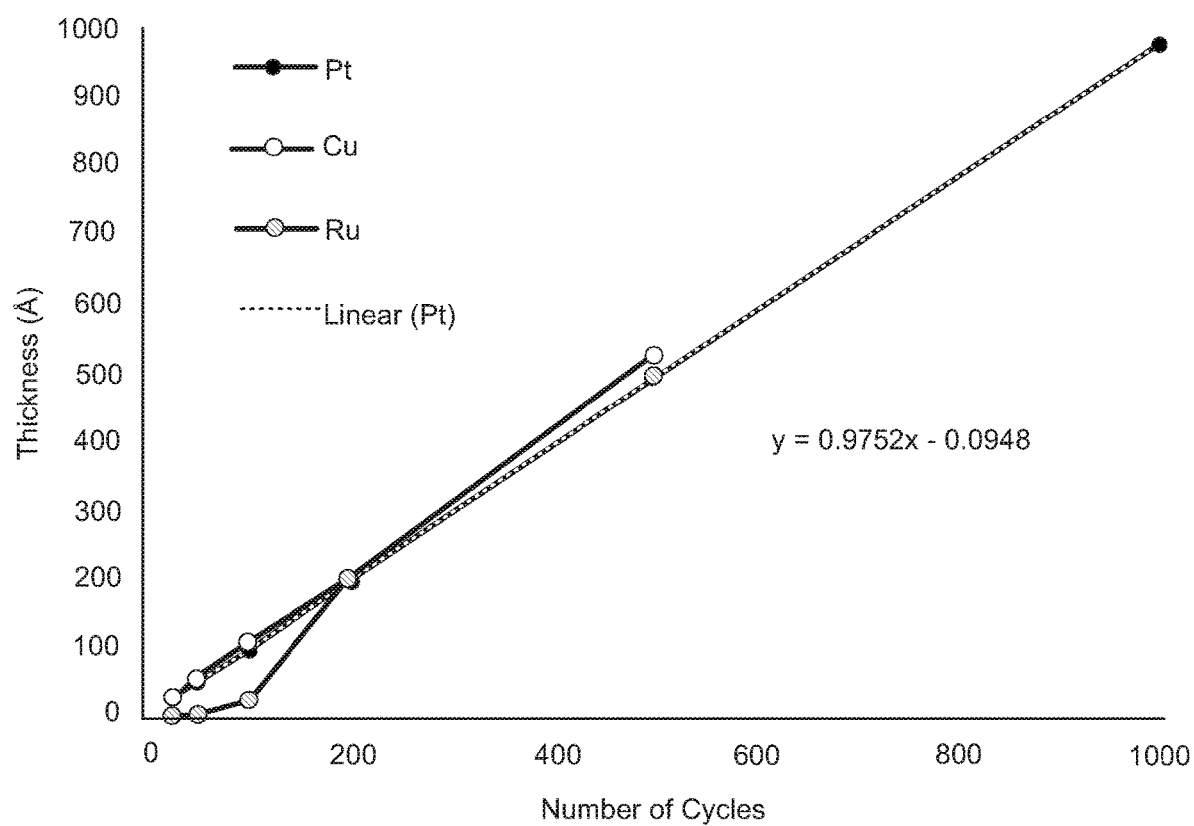
FIG. 10. Plot of thickness versus number of cycles for the early growth stages of cobalt metal on ruthenium, copper, and platinum substrates at 200° C. using $Co(^{tBu2}DAD)_2$ and tert-butyl amine.
Figure 11:
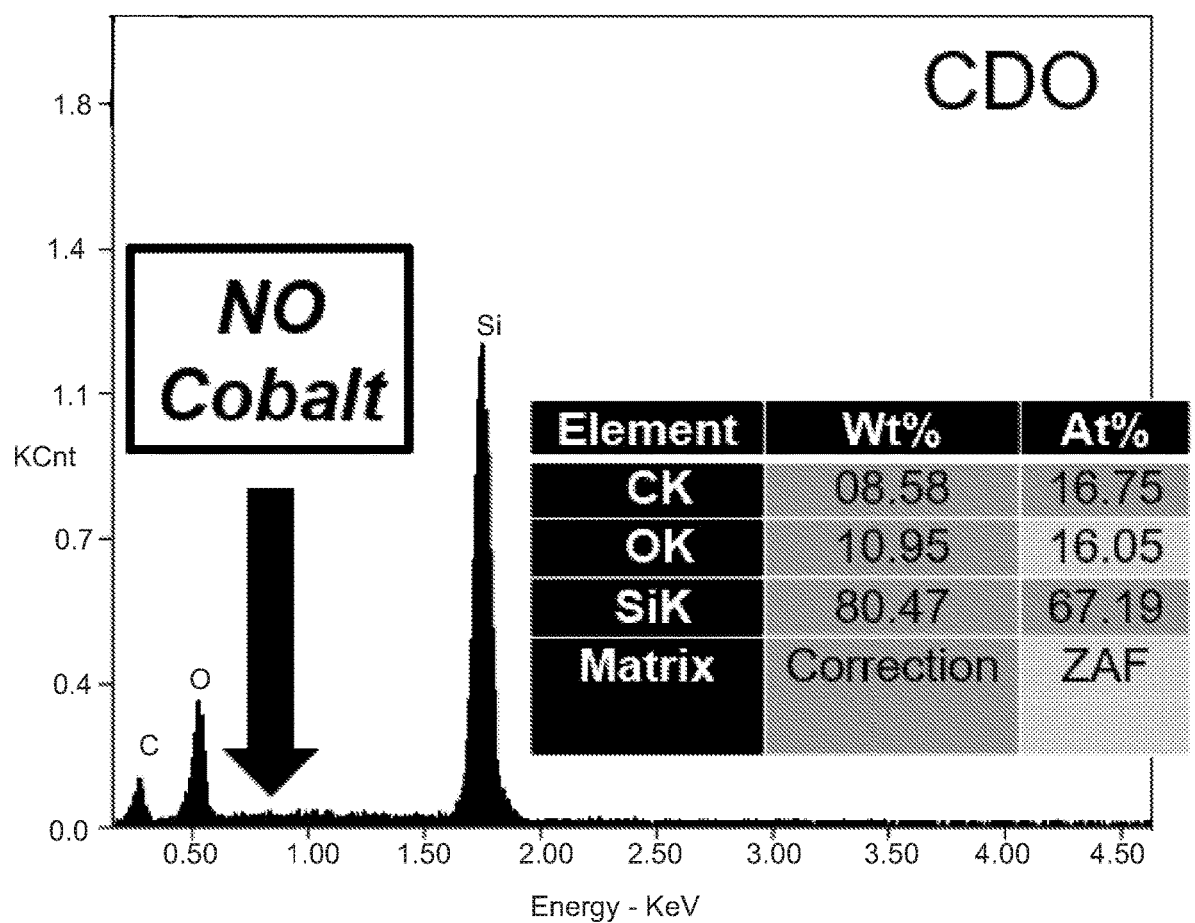
FIG. 11. EDS of a carbon-doped oxide (CDO) substrate after 500 deposition cycles at 200° C.

The early stages of growth of metallic cobalt was assessed on a variety of metallic substrates (platinum, copper, and ruthenium), using Co($^{tBu2}$DAD)$_2$ and tert-butyl amine as precursors (FIG. 10). These experiments used the previously established saturative pulsing sequence of Co($^{tBu2}$DAD)$_2$ (4.0 s), purge (10.0 s), tert-butyl amine (0.2 s), purge (10.0 s) for 25-500 cycles. Linear growth (0.98 Å/cycle) on platinum and copper substrates was observed for ≥25 cycles (~2.5 nm), and showed no nucleation delay. Growth of metallic cobalt films on ruthenium showed a delay in normal growth behavior before 200 cycles. The observed delay in normal growth on ruthenium is likely due to oxidation of the substrate surface, which is then reduced during the initial cycles. Thicknesses were confirmed by cross-sectional SEM on platinum, copper, and ruthenium substrates (FIG. 11).

Bulk resistivities were measured for cobalt films deposited on platinum, copper, and ruthenium substrates (Table 1). Bulk resistivity was calculated as the product of sheet resistivity and film thickness. Bulk resistivities of cobalt films grown on platinum and copper at the early stages of growth suggest the formation of interfacial alloys. In contrast, the resistivities of cobalt films grown on ruthenium at the early stages of growth match that of the bare ruthenium substrate, along with no growth observed by SEM, suggesting no formation of alloys. After 200 cycles, the resistivities of cobalt films grown on all the metallic substrates are similar to that of resistivity value of 13.9-19.1 μΩcm for a ~100 nm thick cobalt film grown on a platinum substrate.

TABLE 1

Resistivities of cobalt films grown on metallic substrates using Co($^{tBu2}$DAD)$_2$ and tert-butyl amine.

| Cycles | Ruthenium$^{a,b}$ | Copper$^{a,c}$ | Platinum$^{a,d}$ |
|---|---|---|---|
| 25 | 55.8 | 1.7 | 46.9 |
| 50 | 55.4 | 1.7 | 44.7 |
| 100 | 48.6 | 2.3 | 36.8 |
| 200 | 19.1 | 13.9 | 18.9 |
| 500 | 15.5 | 14.4 | 14.2 |

$^a$Values are in μΩ cm.
$^b$The measured resistivity of the uncoated ruthenium substrate is 52.1 μΩ cm.
$^c$The measured resistivity of the uncoated copper substrate is 1.7 μΩ cm.
$^d$The measured resistivity of the uncoated platinum substrate is 42.6 μΩ cm.

1.2.4 Description of Attempted Growth of Metallic Cobalt on Non-Metallic Substrates Film growth was attempted, under ALD conditions as set forth above on Si(100), SiO$_2$, Si—H, and CDO substrates. Films were not observed by SEM on any of these non-metallic substrates. The absence of cobalt metal films on these substrates up to 500 cycles was confirmed by cross-sectional SEM and EDS (FIG. 11).

The temperature dependence of substrate-selectivity of this process, known as the selectivity window, was explored. A series of 200-cycle depositions was carried out with the saturative precursor recipe of Co($^{tBu2}$DAD)$_2$ (4.0 s), purge (10.0 s), tert-butyl amine (0.2 s), purge (10.0 s), at varying temperatures. Since applications for selective depositions will require ≤20 nm of cobalt metal, and the observed growth rate for this process is ~1.0 Å/cycle, a 200 cycle limit was imposed to provide relevant insights. The depositions were carried out from 160-220° C. None of the deposition temperatures resulted in the deposition of cobalt on any of the non-metallic substrates. The absence of cobalt metal films on these substrates was confirmed by cross-sectional SEM and EDS.

1.2.5 Trial Depositions for Cobalt Metal using Co($^{tBu2}$DAD)$_2$ and Other Alkyl Amines The growth of metallic cobalt was explored using diethyl amine and triethyl amine as alternative amine precursors. Films were grown using the pulsing sequence Co($^{tBu2}$DAD)$_2$ (4.0 s), purge (10.0 s), diethyl amine (0.2 s)/triethyl amine (0.2 s), purge (10.0 s) at a deposition temperature of 200° C., for 200 cycles. A growth rate of 0.97

Å/cycle was observed using diethyl amine on platinum substrates. The bulk resistivity of the resulting film was 21.3 μΩcm. Films growth was not observed by cross-sectional SEM on Si(100), SiO$_2$, Si—H, and CDO substrates, and no further investigation was conducted on this process. Similarly, cobalt metal depositions on platinum substrates using triethylamine as a precursor resulted in no observable films (as confirmed by cross-sectional SEM). No further investigation was pursued.

1.2.6 Effects of the Purity of the N$_2$ Carrier Gas on Film Growth

Figure 12:
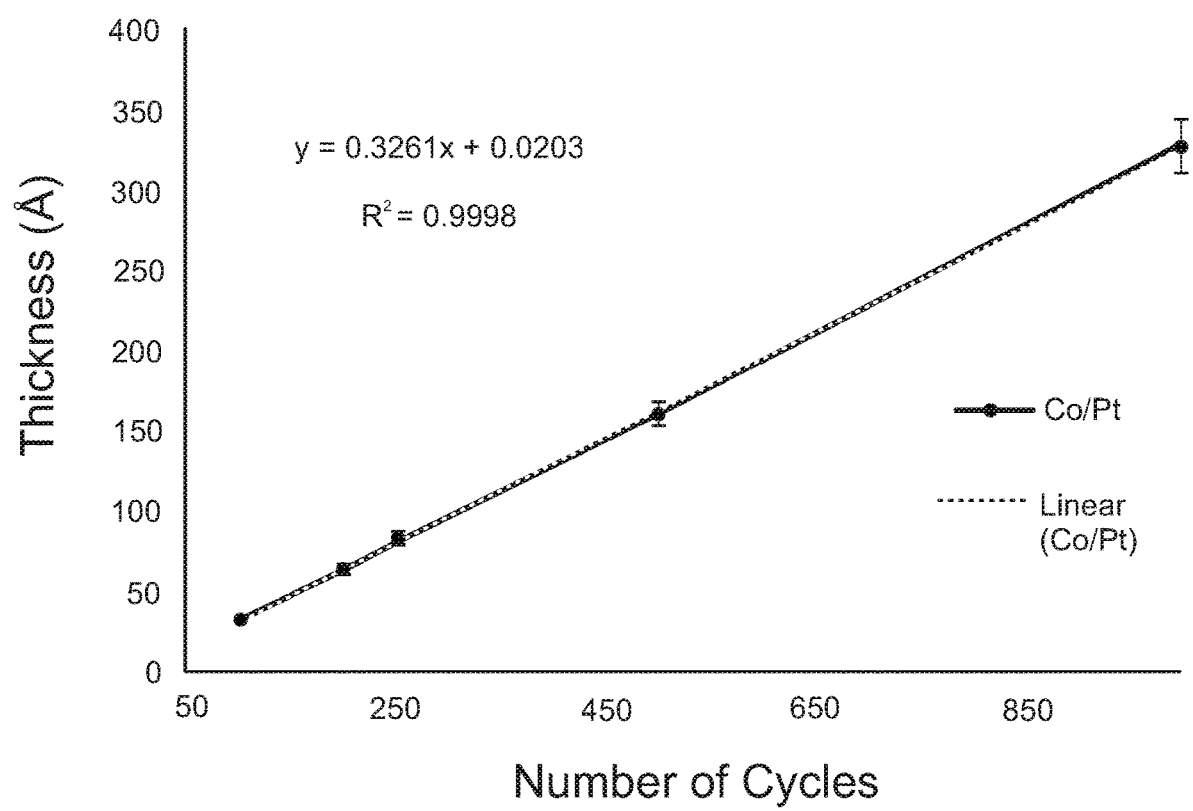
FIG. 12. Plot of thickness versus number of cycles for cobalt metal growth on platinum substrates at 200° C. using $Co(^{tBu2}DAD)_2$ and tert-butyl amine, using lower purity $N_2$ carrier gas.
Figure 13:
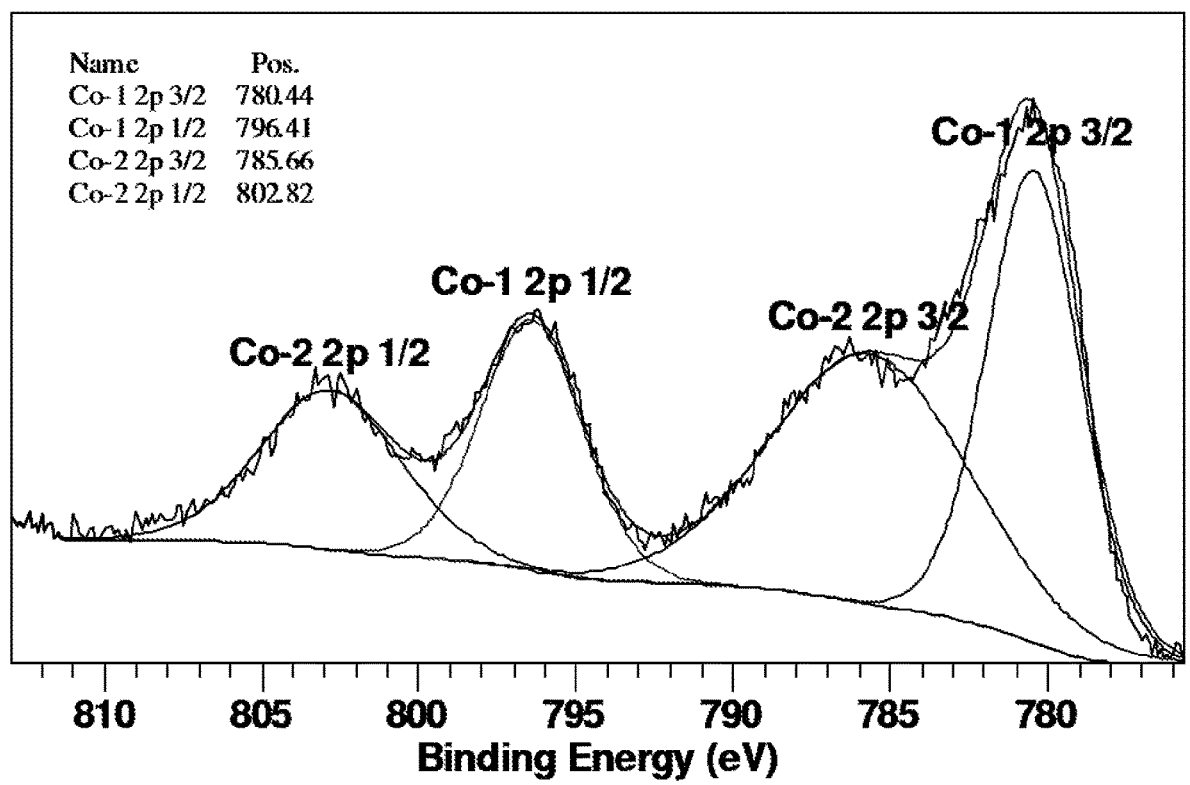
FIG. 13. High-resolution XPS multiplex of cobalt 2p region of an 100 nm thick cobalt film grown on platinum, at 200° C., using $N_2$ produced by a nitrogen generator, $Co(^{tBu2}DAD)_2$, and tert-butyl amine.

Initial experiments for the deposition of metallic cobalt using Co($^{tBu2}$DAD)$_2$ and tert-butyl amine were performed using N$_2$ purified from ambient air, produced from a nitrogen generator, as the carrier and purge gas. The exact purity of the produced N$_2$ was not determined, but was <99.999% N$_2$, with trace impurities of oxygen. Films were grown using the pulsing sequence Co($^{tBu2}$DAD)$_2$ (4.0 s), purge (10.0 s), tert-butyl amine (0.2 s), purge (10.0 s) at a deposition temperature of 200° C., for a varying number of cycles. The growth rate obtained using the lower purity carrier gas was 0.33 Å/cycle (FIG. 12). In contrast, the growth rate obtained with the ultra-high purity carrier gas was 0.98 Å/cycle. The difference in growth rate for this process, with only the purity of the carrier gas varying, is likely due to the formation of cobalt (II) oxide in the deposited film. The presence of cobalt (II) oxide inhibits growth of the metallic cobalt film, since this process shows inherent selectivity for deposition on metallic substrates over non-metallic substrates. XPS analysis of a 100 nm thick cobalt film reveals oxidation throughout the film, even after eight minutes of argon ion sputtering (FIG. 13). These results show the significant impact that the purity of the carrier gas has on the process using Co($^{tBu2}$DAD)$_2$ and tert-butyl amine to deposit thin films of metallic cobalt.

1.3 Conclusions

The growth of cobalt metal by low temperature thermal ALD from Co($^{tBu2}$DAD)$_2$ and tert-butyl amine at 200° C. on various substrates was demonstrated. On platinum and copper substrates, a linear growth rate of 0.98 Å/cycle from 25-500 cycles was observed for plots of thickness versus the number of cycles. The y-intercept for this plot was within experimental error of zero, indicating no nucleation delay, with normal growth observed for as little as 2.5 nm of cobalt on platinum and copper substrates. Growth on ruthenium substrates showed a delay of 200 cycles before a normal growth rate was observed, with no films observed after 25 and 50 cycles. Rapid growth is observed between 100 and 200 cycles thereby suggesting the occurrence of decomposition growth at the early stages of growth, and is likely due to surface oxidation of the ruthenium substrate. Cobalt metal films on platinum substrates after 100 cycles (~10 nm thick) and 1000 cycles (~100 nm) were analyzed by AFM, with respective rms surface roughnesses of 0.22 nm (2.2% of total thickness), and 3.07 nm (3.1% of total thickness). The rms roughness values show that these films are smooth and continuous over a wide range of thicknesses. XPS analyses reveal that this process deposits high-purity cobalt metal. Films grown on ruthenium, platinum, and copper substrates showed low resistivities of <20 μΩcm after 200 cycles. Growth of cobalt metal by this process is inherently selective for growth on metallic substrates over non-metallic substrates, with no film growth observed after 500 cycles on Si(100), Si—H, thermal SiO$_2$ and CDO substrates. Selective deposition of cobalt metal on metallic substrates over non-metallic substrates occurs over a selectivity window of 160-220° C.

1.4 Experimental Section

A Picosun R-75BE ALD reactor was used for the thin film deposition experiments. Ultra-high purity nitrogen (99.999%, purchased from Airgas) was used as the carrier and purge gas for all depositions, except for the depositions performed to assess the effect of the purity of the carrier gas. Nitrogen (<99.999%) was used as both the carrier and purge gas and was purified from ambient air using a Texol GeniSys nitroGenerator, for experiments assessing the effect of the purity of the carrier gas. The ALD reactor had a constant flow of the same ultra-high purity nitrogen in the deposition chamber for all depositions, with a pressure of 6-9 Torr. The low-temperature ALD of metallic cobalt thin films was performed using Co($^{tBu2}$DAD)$_2$ and tert-butyl amine as precursors. Co($^{tBu2}$DAD)$_2$ was prepared according to a literature procedure. (Knisley, T. J.; Saly, M. J.; Heeg, M. J.; Roberts, J. L.; Winter, C. H. *Organometallics* 2011, 30, 5010-5017). All alkyl amines used in depositions (tert-butyl amine, diethyl amine, and trimethylamine) were purchased from Sigma Aldrich. In initial growth trials, the source temperature for Co($^{tBu2}$DAD)$_2$ was found to be optimum at 130° C. under the reactor pressure, and Co($^{tBu2}$DAD)$_2$ was delivered by a Picosun solid state booster, while tert-butyl amine was delivered by a vapor-draw ampule at 20° C. Substrate temperatures were varied between 160 and 220° C. Film growth experiments used to assess selectivity were performed using the pulse sequence Co($^{tBu2}$DAD)$_2$ (4.0 s)/N$_2$ purge (10.0 s)/tert-butyl amine (0.2 s)/N$_2$ purge (10.0 s) at 200° C. For the selectivity temperature window experiments, the same pulse and purge sequence was used, but the deposition temperatures were varied from 160-220° C. ALD growth studies were performed on Ru (13 nm)/TaN (2 nm)/SiO$_2$ (100 nm)/Si(100), Cu (33 nm)/TaN (7 nm)/SiO$_2$ (100 nm)/Si(100), Pt (10 nm)/SiO$_2$ (100 nm)/Si(100), Si(100) with native oxide, Si—H, thermal SiO$_2$ (100 nm)/Si(100), and CDO (~40 nm)/SiO$_2$ (100 nm)/Si(100) substrates. Si—H substrates were prepared by treating Si(100) with native oxide substrates with a 2% aqueous HF solution, followed by rinsing with deionized water and then drying with a stream of clean, dry air. The other substrates were used as received, except that they were rinsed sequentially with isopropanol and deionized water and then were dried with a stream of clean, dry air. One substrate of each kind, a 2×2 cm$^2$ coupon, was used in each experiment.

Film thicknesses were determined using cross-sectional SEM collected on a JEOL-6510LV electron microscope. The growth rates were determined by dividing the measured film thicknesses by the number of deposition cycles. Film thicknesses were measured at a minimum of three positions on each film to evaluate the uniformity. EDS was carried out on the JEOL-6510LV electron microscope using an Ametek EDAX system with Genesis Spectrum software. The accelerating voltage for the EDS measurements was 6 kV. AFM measurements were conducted using a Bruker BioScope Catalyst AFM using contact mode. XPS measurements were conducted using an Al Kα (1486.6 eV) X-ray source at a chamber base pressure of 10$^{-10}$ Torr. Spectra were recorded using a 16-channel detector with a hemispherical analyzer. Sputtering was performed using argon ions supplied by an argon sputter gun positioned at a 45° angle with respect to the substrate normal. Each sample was sputtered over a 2×2 mm$^2$ area and measured over a 0.8×0.8 mm$^2$ area. Cobalt metal standards were sputtered with 5 keV argon ions. An uncoated platinum substrate (Pt (10 nm)/SiO$_2$ (100 nm)/Si (100)) was used as a standard for platinum and was sputtered with 3 keV argon ions. The ALD-grown cobalt films on platinum were sputtered with 3 keV argon ions. Sheet resistivity measurements were obtained using a Jandel 4-point probe in combination with a Keithley 2400 SourceMeter and a Keithley 2182A Nanovoltmeter. All films grown on metal substrates passed the Scotch tape test.

Nickel Metal Thin Films 2.1 Introduction

Figure 14:
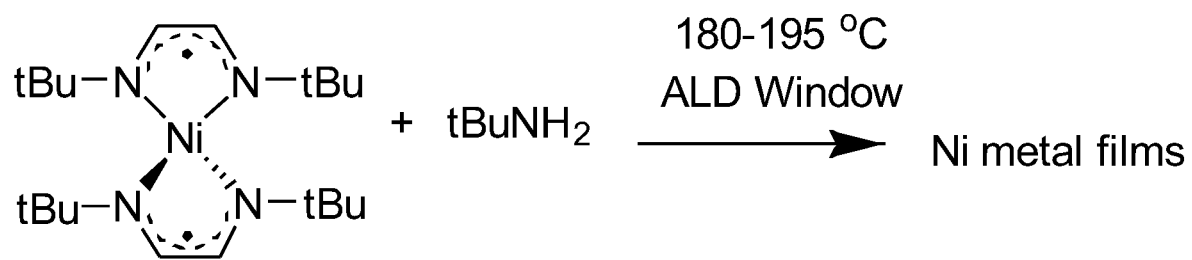
FIG. 14. General reaction scheme for the deposition of nickel metal thin films from $Ni(^{tBu2}DAD)_2$ and tert-butyl amine by thermal ALD.

As set forth below, the growth of metallic nickel was demonstrated on a variety of substrates using Ni($^{tBu2}$DAD)$_2$ and tert-butyl amine as precursors (FIG. 14). When using tert-butyl amine, a growth rate of 0.60 Å/cycle was achieved in the ALD window of 180-195° C. The resultant films were continuous, featured high-purity metallic nickel films, and exhibited low resistivity values when grown on metallic substrates.

Figure 15:
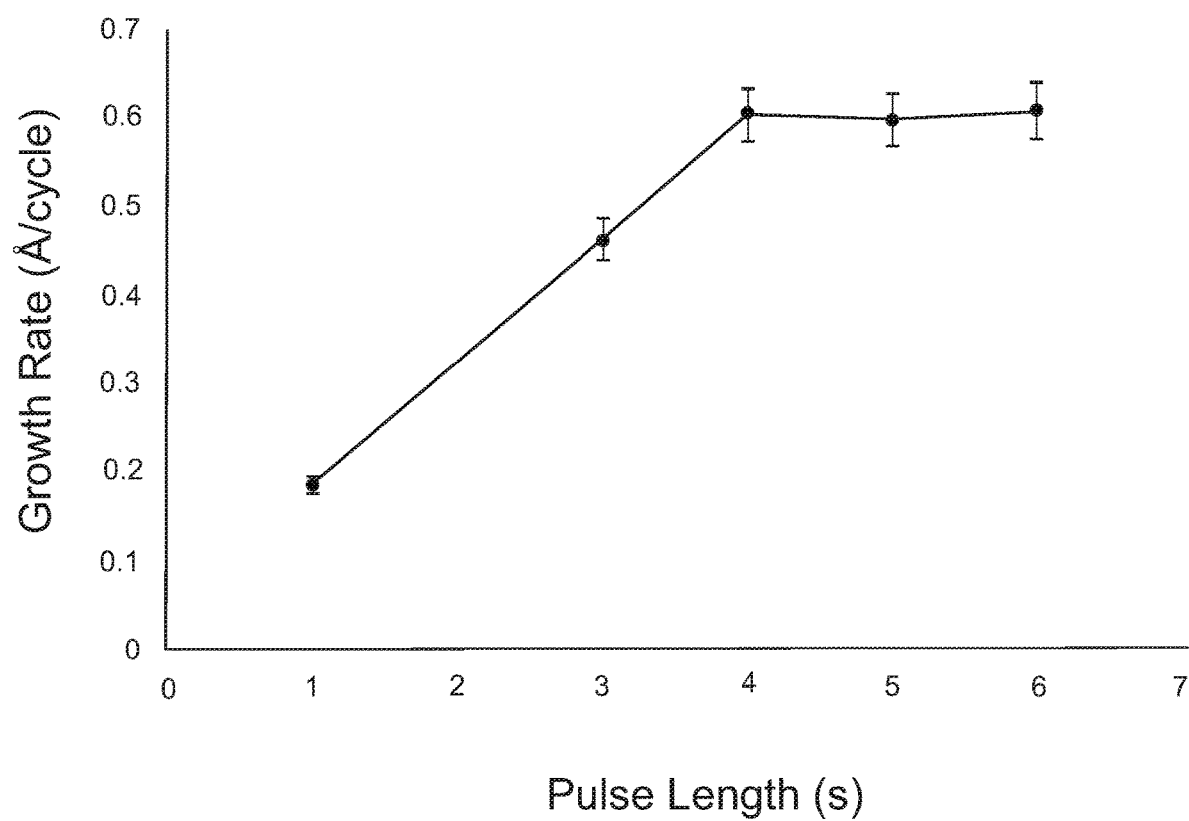
FIG. 15. Plot of growth rate of nickel metal on platinum substrates versus pulse length of $Ni(^{tBu2}DAD)_2$ after 500 cycles, using $Ni(^{tBu2}DAD)_2$ and tert-butyl amine as precursors.
Figure 16:
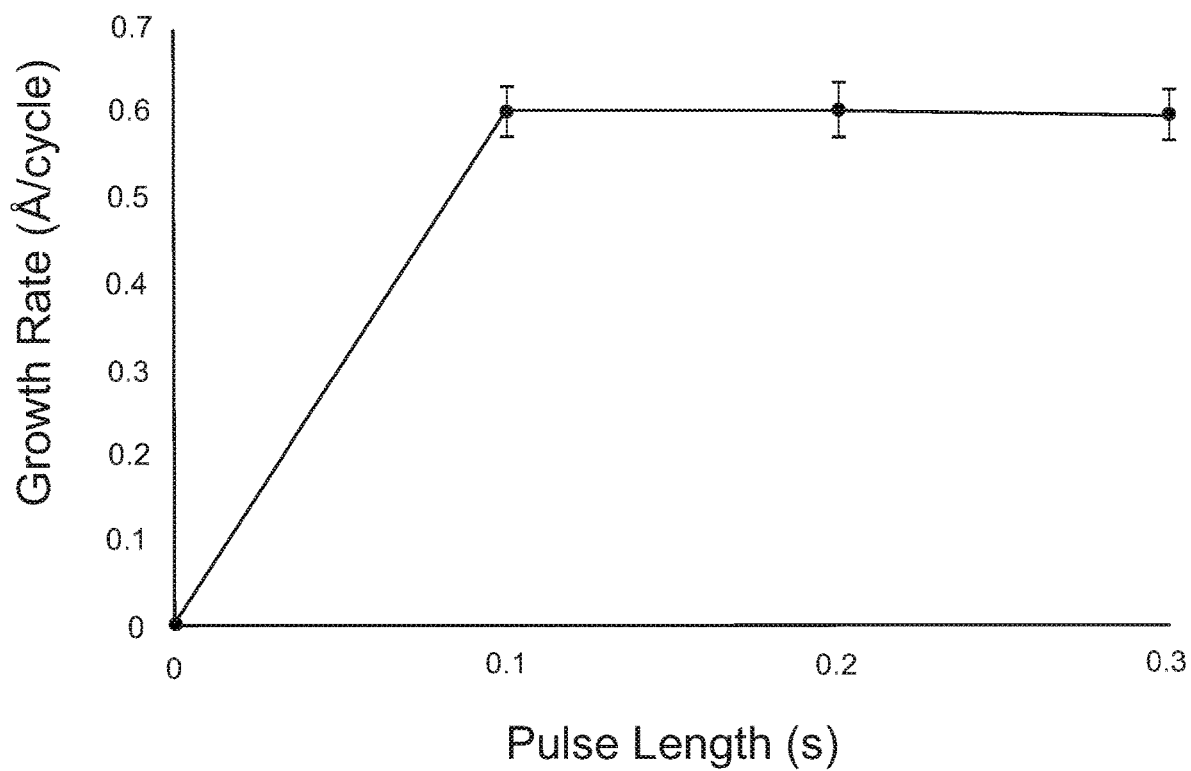
FIG. 16. Plot of growth rate of nickel metal on platinum substrates versus pulse length of tert-butyl amine after 500 cycles, using $Ni(^{tBu2}DAD)_2$ and tert-butyl amine as precursors.

2.2 Results and Discussion 2.2.1 Low Temperature ALD Study of Nickel Metal from Ni($^{tBu2}$DAD)$_2$ and Tert-Butyl Amine Experiments to demonstrate ALD growth of metallic nickel using Ni($^{tBu2}$DAD)$_2$ and tert-butyl amine were performed on platinum substrates. First, self-limiting growth was established by varying the pulse length of one co-reagent at a time while keeping all other conditions constant, then plotting the growth rate as a function of precursor pulse length. Experiments to evaluate Ni($^{tBu2}$DAD)$_2$ saturation used a pulsing sequence of Ni($^{tBu2}$DAD)$_2$ (varied), purge (10.0 s), tert-butyl amine (0.2 s), purge (10.0 s) for 500 cycles, at a deposition temperature of 180° C. Self-limited growth was observed after ≥4.0 s pulse lengths of Ni($^{tBu2}$DAD)$_2$, as evidenced by a constant growth rate of 0.60 Å/cycle (FIG. 15). Saturation of tert-butyl amine was determined by varying the pulse length of tert-butyl amine, keeping all other deposition parameters constant. These experiments used a pulsing sequence of Ni($^{tBu2}$DAD)$_2$ (5.0 s), purge (10.0 s), tert-butyl amine (varied), purge (10.0 s) for 500 cycles, at a deposition temperature of 180° C. Self-limited growth was observed after ≥0.1 s pulse lengths of tert-butyl amine, as evidenced by a constant growth rate of 0.60 Å/cycle (FIG. 16).

Figure 17:
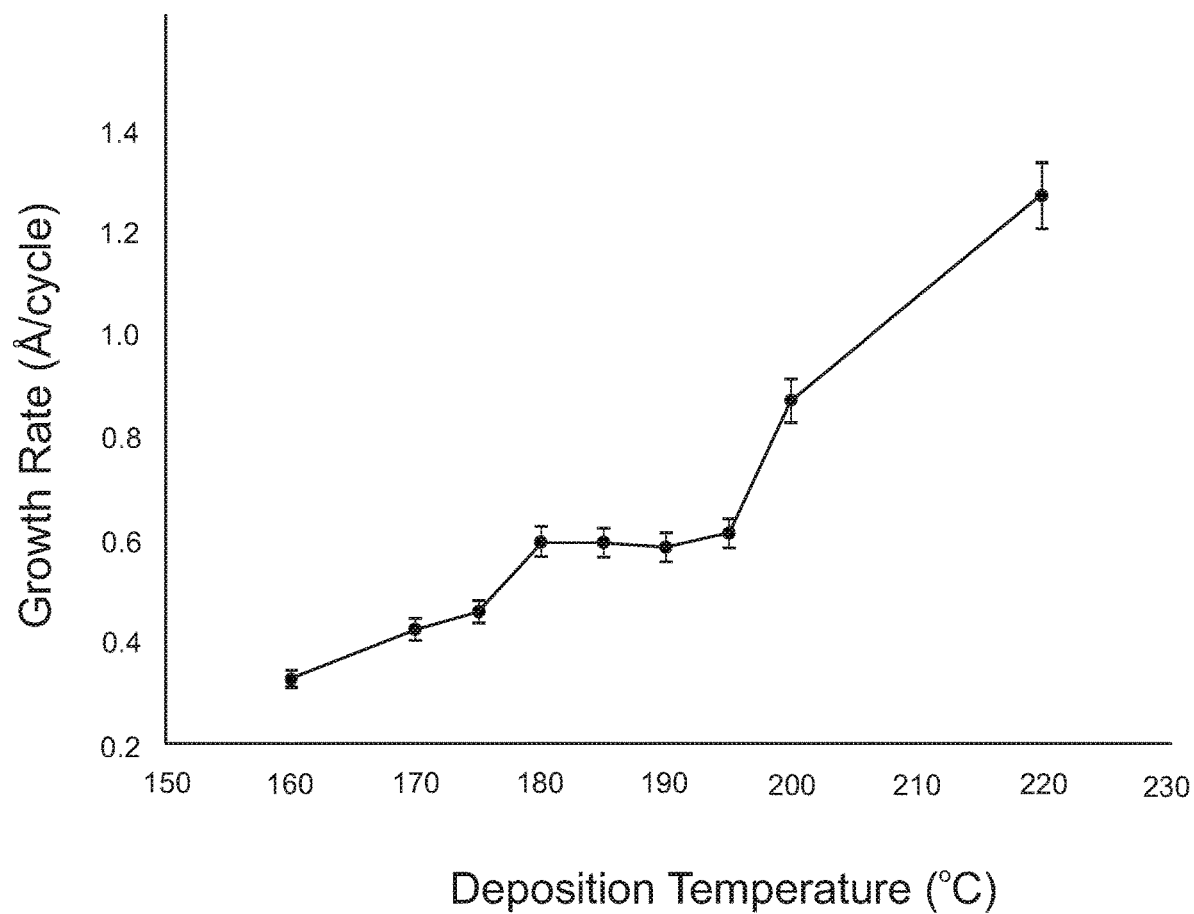
FIG. 17. Plot of growth rate versus deposition temperature for nickel metal growth on platinum substrates after 250 cycles using $Ni(^{tBu2}DAD)_2$ and tert-butyl amine.

To assess temperature dependence, experiments to construct an ALD window were performed. Films were grown using a saturative pulsing sequence of Ni($^{tBu2}$DAD)$_2$ (5.0 s), purge (10.0 s), tert-butyl amine (0.1 s), purge (10.0 s) at temperatures within 160-220° C., each for 250 cycles. Due to the decomposition temperature of 230° C. for Ni($^{tBu2}$DAD)$_2$, higher temperatures were not evaluated. (Knisley, T. J.; Saly, M. J.; Heeg, M. J.; Roberts, J. L.; Winter, C. H. Organometallics 2011, 30, 5010-5017). A constant growth rate of 0.60 Å/cycle was observed between 180-195° C. for films deposited on platinum substrates (FIG. 17). Cross-sectional SEM images revealed uniform, continuous films deposited on platinum in the ALD window.

Figure 18:
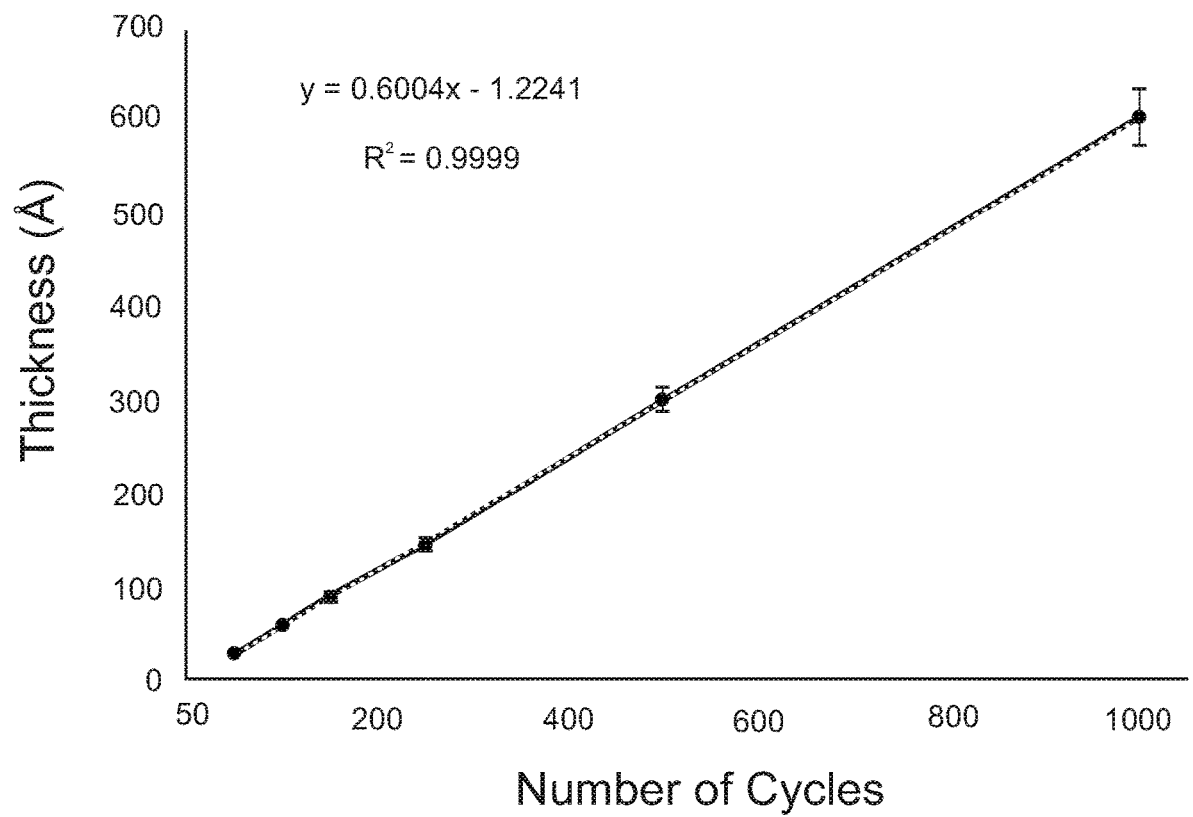
FIG. 18. Plot of thickness versus number of cycles for nickel metal growth on platinum substrates at 200° C. using $Ni(^{tBu2}DAD)_2$ and tert-butyl amine.

To evaluate the growth of this process as a function of number of ALD cycles, the same saturative dose pulsing sequence used for the ALD window determination was used, at a deposition temperature of 180° C., while varying the number of cycles. The resulting plot shows a slope of 0.60, which corresponds to a constant growth rate of 0.60 Å/cycle on platinum from 25-1000 cycles (FIG. 18). The y-intercept of 1.22 is within experimental error of zero, indicating that as few as 50 cycles (~3.0 nm) are needed to achieve normal ALD growth without a nucleation delay.

Figure 19:
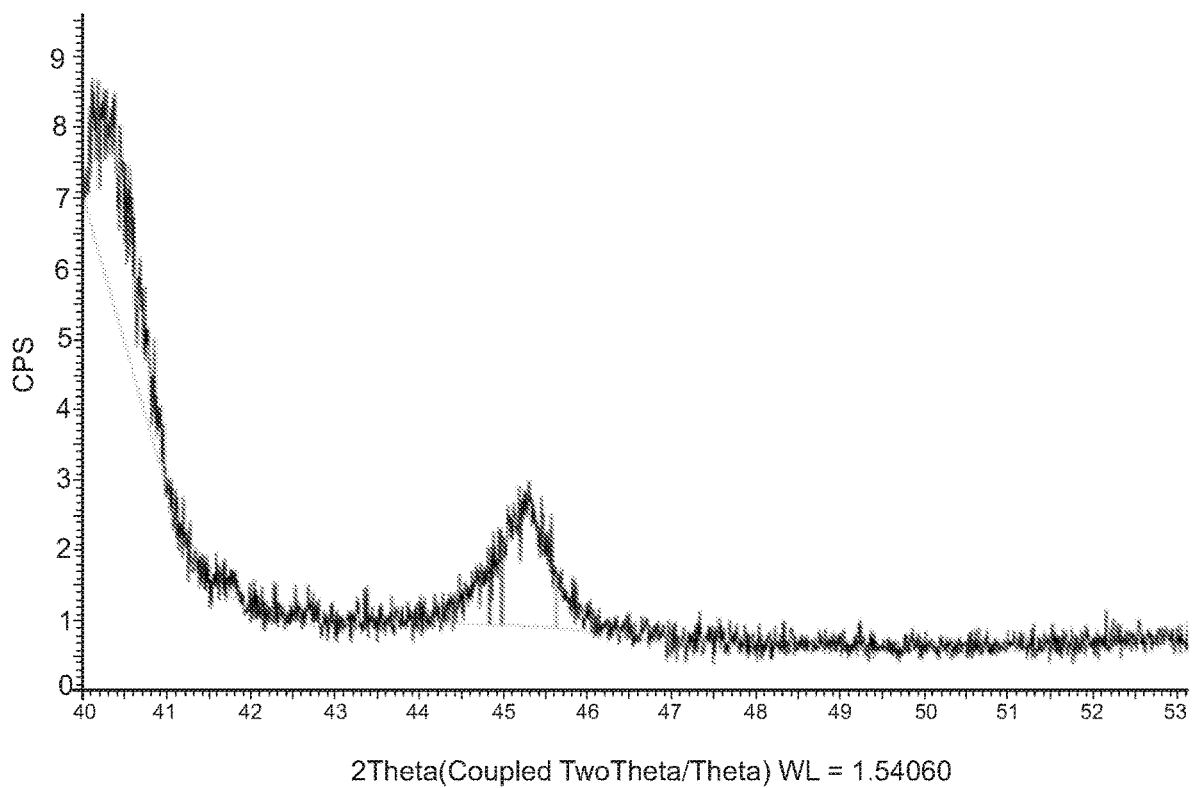
FIG. 19. X-ray diffraction pattern for a ~60 nm thick nickel metal film grown on a platinum substrate at 180° C. using $Ni(^{tBu2}DAD)_2$ and tert-butyl amine.

2.2.2 Characterization of Films Deposited by ALD Using Ni($^{tBu2}$DAD)$_2$ and Tert-Butyl Amine XRD was performed on a ~60 nm thick nickel film grown on a platinum substrate to assess the degree of crystallinity of the as-deposited film (FIG. 19). The XRD pattern displayed reflections consistent with that of previously determined XRD pattern for the bare substrate. Nickel metal reflections appear in a similar region to the peak from the platinum substrate, making the information from this XRD spectrum inconclusive. Follow-up XRD confirmed the presence of crystalline Ni metal.

AFM was performed to examine the surface topologies of nickel films of different thicknesses (~18 nm and ~60 nm) grown on platinum substrates. The uncoated platinum substrate has been previously measured to have an rms roughness value of 0.19 nm. (Kerrigan, M. M.; Klesko, J. P.; Rupich, S. M.; Dezelah, C. L.; Kanjolia, R. K.; Chabal, Y. J.; Winter, C. H. J. Chem. Phys. 2017, 146, 052813). The ~18 nm thick film had an rms roughness value of 0.45 nm over the full 5×5 μm$^2$ area, which corresponds to 2.5% of the total film thickness. The ~60 nm thick film had an rms roughness value of 1.52 nm over the full 5×5 μm$^2$ area, which corresponds to 2.5% of the total film thickness. These rms roughness values indicate that over a wide span of thicknesses, the as-deposited films from this process are extremely smooth.

Figure 20A:
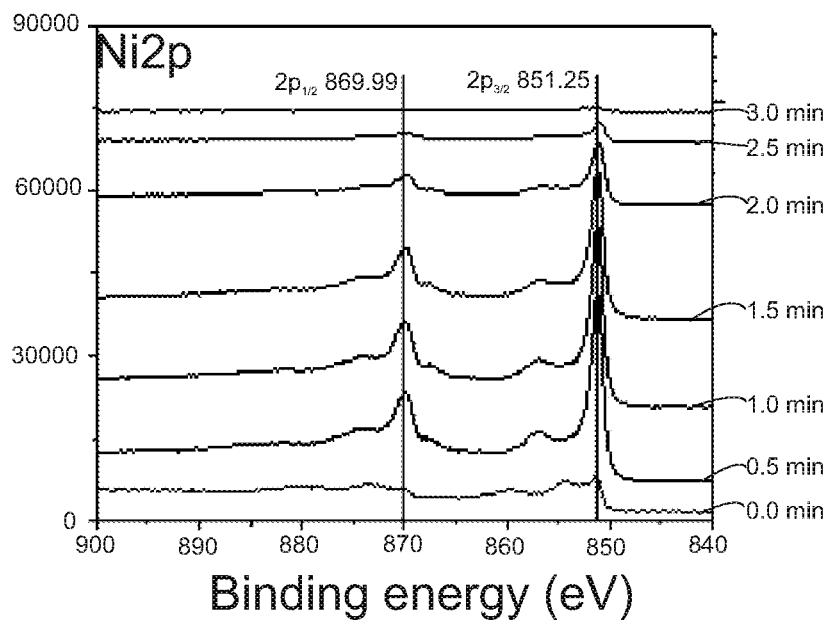
FIGS. 20A, 20B, and 20C. High-resolution XPS multiplex of nickel 2p region of A) 18 nm and B) 60 nm thick nickel film grown on platinum, at 180° C., using $Ni(^{tBu2}DAD)_2$ and tert-butyl amine; C) reference nickel film.
Figure 20B:
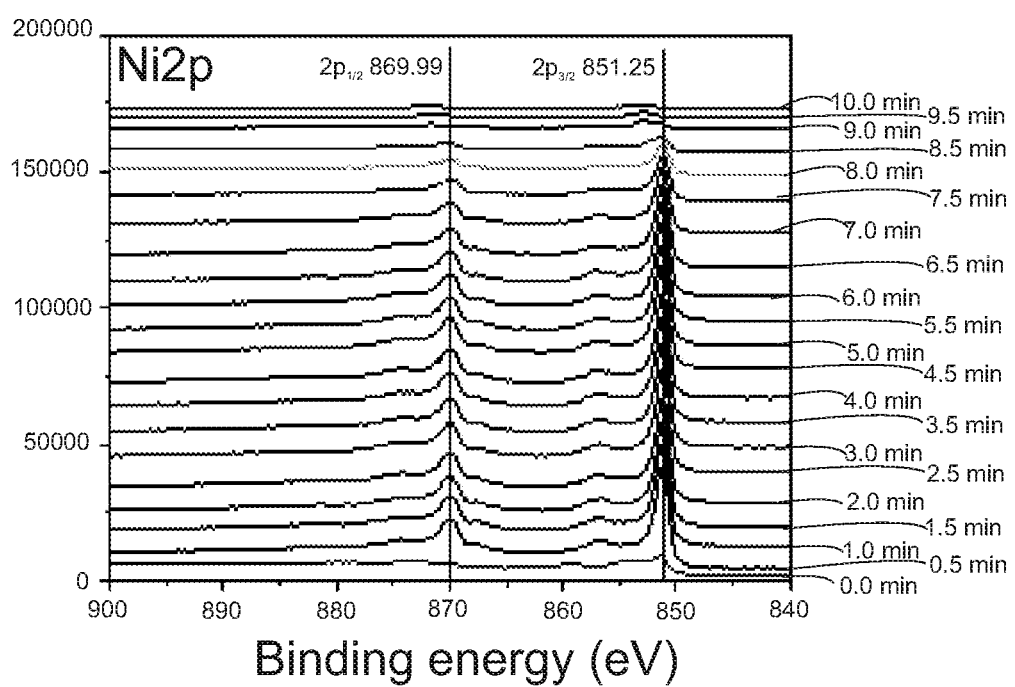
Figure 20C:
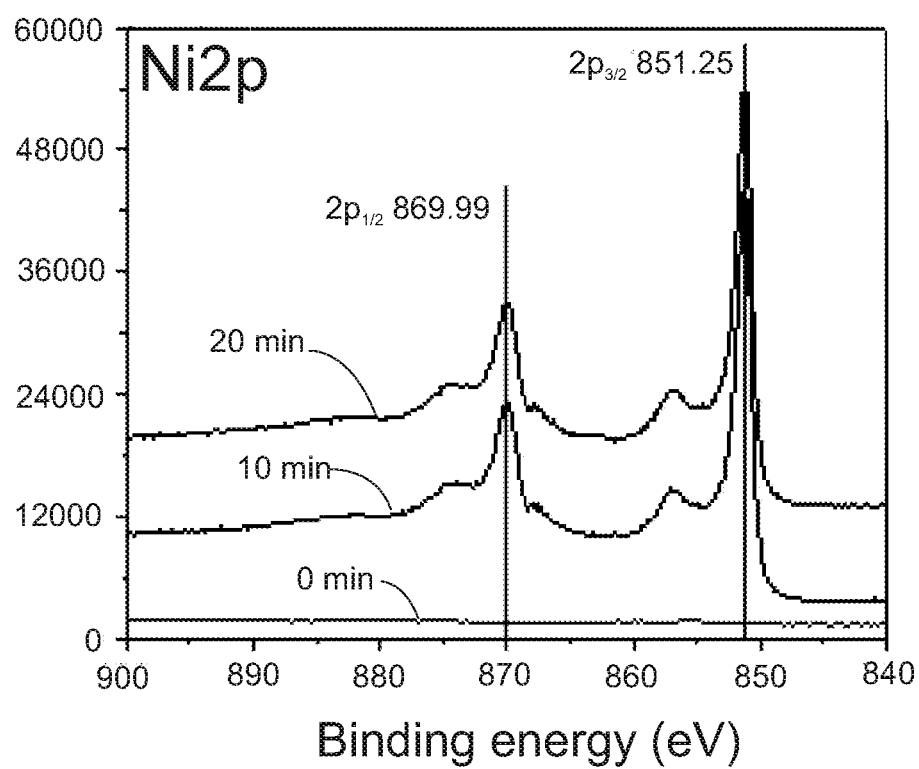
Figures 21A, 21B:
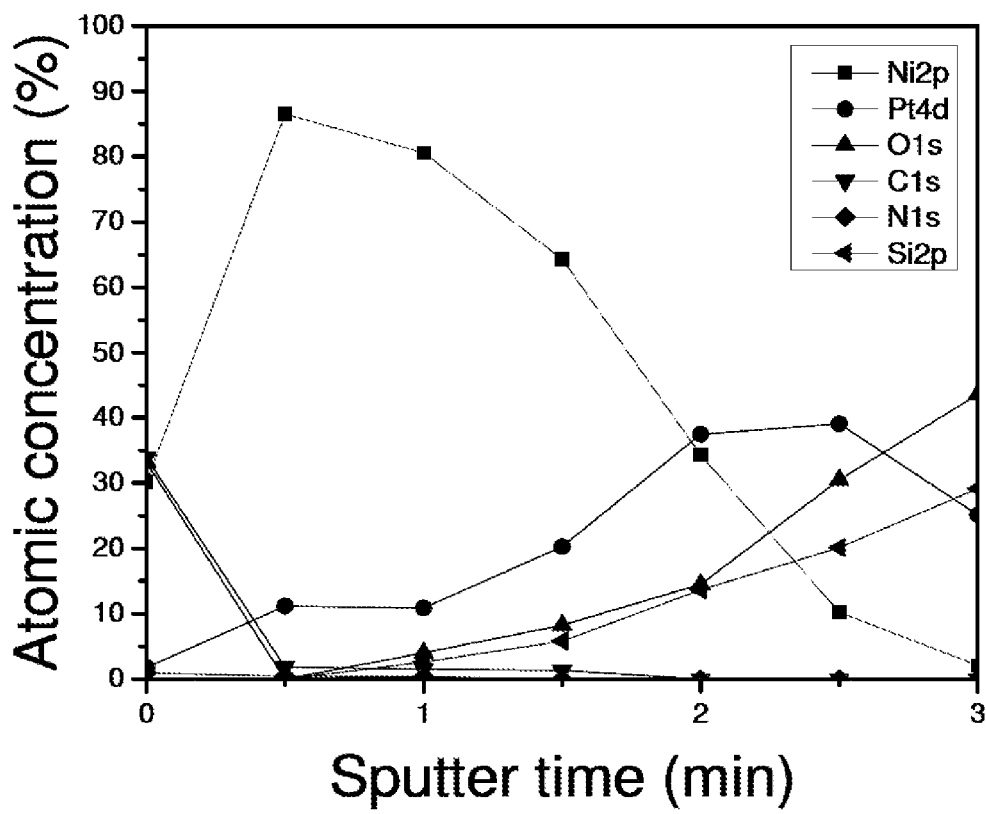
FIGS. 21A and 21B. A) XPS depth profile and B) elemental compositions of an 18 nm thick nickel film grown on platinum at 180° C. using $Ni(^{tBu2}DAD)_2$ and tert-butyl amine.
Figures 22A, 22B:
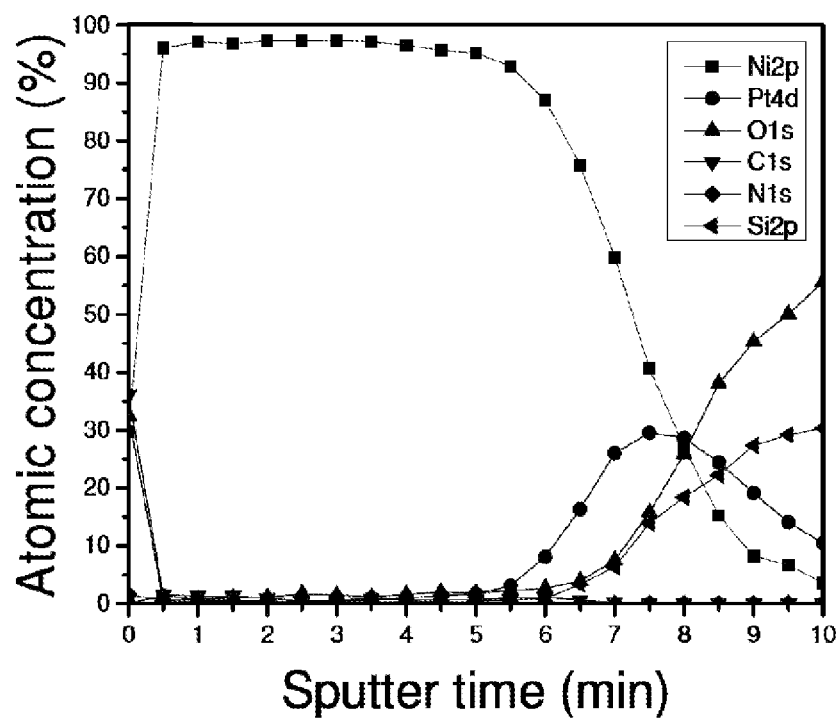
FIGS. 22A and 22B. A) XPS depth profile and B) elemental compositions of a 60 nm thick nickel film grown on platinum at 180° C. using $Ni(^{tBu2}DAD)_2$ and tert-butyl amine.

XPS was performed to assess the purity and elemental composition of the as-deposited films of different thicknesses of nickel films (~18 nm and ~60 nm) grown on platinum substrates, at 180° C. Analysis of the high-resolution multiplex of the Ni 2p core shell reveals binding energies which correspond with metallic nickel (Ni 2p$_{3/2}$ 851.25 eV and Ni 2p$_{1/2}$ 869.99 eV) after as little as 0.5 minutes of sputtering, for both samples (FIG. 20 A, B). These binding energies are consistent with values obtained from a nickel metal standard (Ni 2p$_{3/2}$ 851.25 eV and Ni 2p$_{1/2}$ 869.99 eV) (FIG. 20C). XPS depth profiling was performed to assess the elemental composition of the films. The ~18 nm thick film was analyzed to assess whether intermixing of the nickel film and platinum substrate occurred. Significant amounts of platinum (>10%) were observed immediately upon sputtering for 0.5 min (FIG. 21). The ~60 nm thick film was analyzed to assess purity of the deposited films, which revealed >97% pure nickel metal upon sputtering, with trace impurities (<1%) of carbon, oxygen, and nitrogen (FIG. 22).

2.2.3 Description of Growth of Nickel Metal on Metallic Substrates

Figure 23:
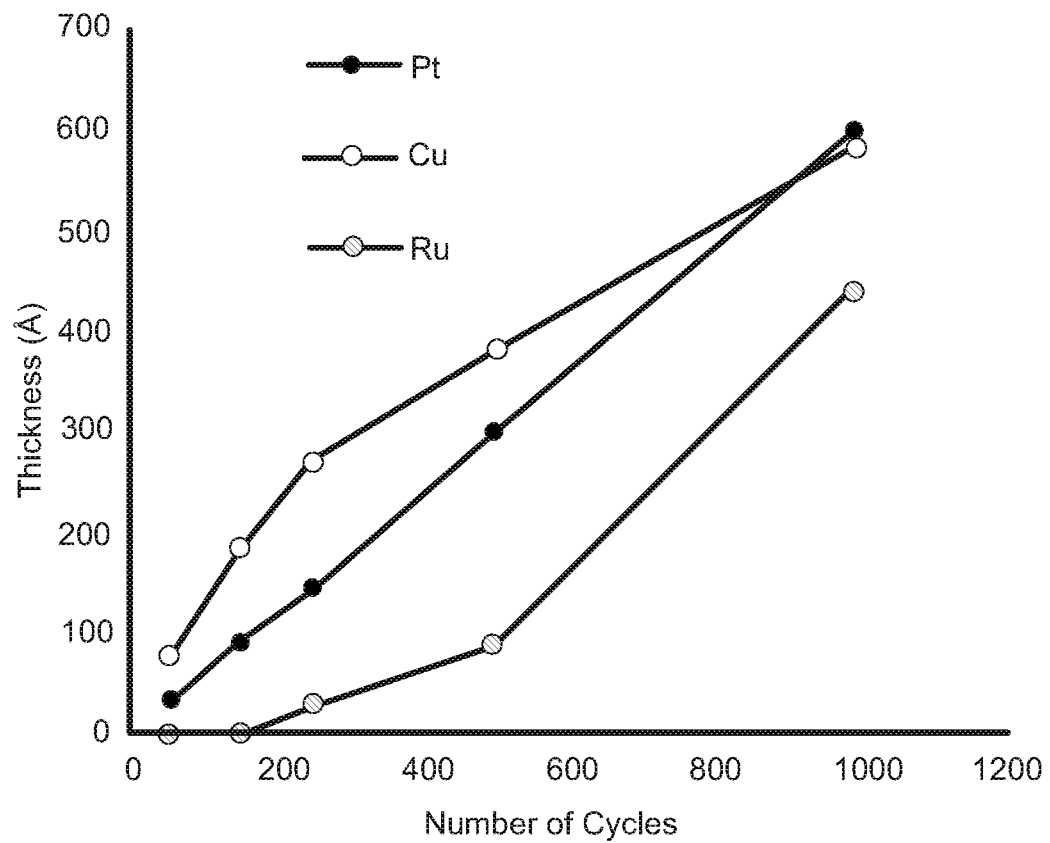
FIG. 23. Plot of thickness versus number of cycles for the growth of nickel metal on ruthenium, copper, and platinum substrates at 180° C. using $Ni(^{tBu2}DAD)_2$ and tert-butyl amine.

The early stages of growth of metallic nickel were demonstrated on a variety of metallic substrates (platinum, copper, and ruthenium) using Ni($^{tBu2}$DAD)$_2$ and tert-butyl amine as precursors. These experiments used a previously established saturative pulsing sequence of Ni($^{tBu2}$DAD)$_2$ (5.0 s), purge (10.0 s), tert-butyl amine (0.2 s), purge (10.0 s) for 50-1000 cycles. Film growth as a function of number of cycles was analyzed, with thicknesses confirmed by cross-sectional SEM, on platinum, copper, and ruthenium (FIG. 23). Linear growth was observed on platinum substrates ≥50 cycles (~3.0 nm), showing no nucleation delay for this process on these substrates. Although linear growth was observed on platinum substrates, the growth on ruthenium and copper was not linear in relation to the number of cycles. Growth of metallic nickel films on ruthenium substrates shows a delay in growth before 250 cycles (growth rate of 0.12 Å/cycle), and varying growth rates at 500 (0.18 Å/cycle) and 1000 (0.44 Å/cycle) cycles. This delay in normal growth behavior has been observed for the analogous cobalt process (vide supra) and is likely due to oxidation of the substrate surface, which is then reduced during the initial cycles. (Kerrigan, M. M.; Klesko, J. P.; Rupich, S. M.; Dezelah, C. L.; Kanjolia, R. K.; Chabal, Y. J.; Winter, C. H. J. Chem. Phys. 2017, 146, 052813). Further depositions (1500 and 2000 cycles) will be explored to ascertain if ALD growth on ruthenium occurs. Growth of metallic nickel films on copper substrates shows high growth rates at the early stages of growth (1.6 Å/cycle) which tapers down significantly by 1000 cycles (0.59 Å/cycle). The peculiar growth behavior could be due to a catalytic reaction with the copper surface, where precursor interaction with the copper substrate is necessary for the reaction to proceed, with similar growth behavior previously reported for nickel metal grown on ruthenium. (Kalutarage, L. C.; Martin, P. D.; Heeg, M. J.; Winter, C. H. *J. Am. Chem. Soc.* 2013, 135, 12588-12591).

Bulk resistivities were measured for cobalt films deposited on platinum, copper, and ruthenium substrates (Table 2). Bulk resistivity was calculated as the product of sheet resistivity and film thickness. The as deposited nickel films grown on platinum have low resistivities, with the resistivity for a 60 nm thick nickel film being 22.1 μΩcm. For comparison, bulk resistivity of nickel metal at 22° C. is 6.99 μΩcm. The resistivities of thinner (<60 nm) nickel films grown on platinum have higher resistivities (~32-45 μΩcm), likely due to the significant intermixing of the nickel and platinum layers as seen by XPS. The resistivities of nickel films grown on ruthenium at the early stages of growth match that of the bare ruthenium substrate, indicating the absence of nickel metal. SEM images also support that no film growth is observed at less than 250 cycles. The delay in growth on ruthenium is likely due to surface oxidation of the ruthenium (vide supra). The resistivity of the nickel films on ruthenium after 1000 cycles is 30.6 μΩcm, which is comparable to the nickel films grown on platinum of similar thickness (31.8 μΩcm). The comparable resistivities suggest that the nickel films grown after 1000 cycles on ruthenium are similar in quality to the films grown on platinum. The resistivity measured for nickel metal films grown on copper after 1000 cycles is 22.9 μΩcm, which is within experimental error of nickel films of similar thickness grown on platinum. Low resistivities are observed for nickel films grown on copper from 150-500 cycles as well (~27-37 μΩcm). After 50 growth cycles, the resistivity of the ~8 nm thick nickel film grown on copper is that of the copper substrate (1.7 μΩcm), which is consistent with the conduction occurring through the lower resistivity copper substrate. It is also possible that intermixing of the nickel and copper layers occur, which will be further investigated with XPS.

TABLE 2

Resistivities of nickel films grown on metallic substrates using Ni($^{tBu2}$DAD)$_2$ and tert-butyl amine at 180° C.

| Cycles | Ruthenium[a,b] | Copper[a,c] | Platinum[a,d] |
|---|---|---|---|
| 50 | 53.0 | 1.7 | 44.8 |
| 150 | 52.8 | 36.7 | 38.6 |
| 250 | 51.1 | 34.2 | 36.8 |
| 500 | 49.4 | 26.7 | 31.8 |
| 1000 | 30.6 | 22.9 | 22.1 |

[a]Values are in μΩ cm.
[b]The measured resistivity of the uncoated ruthenium substrate is 52.1 μΩ cm.
[c]The measured resistivity of the uncoated copper substrate is 1.7 μΩ cm.
[d]The measured resistivity of the uncoated platinum substrate is 42.6 μΩ cm.

Figure 24:
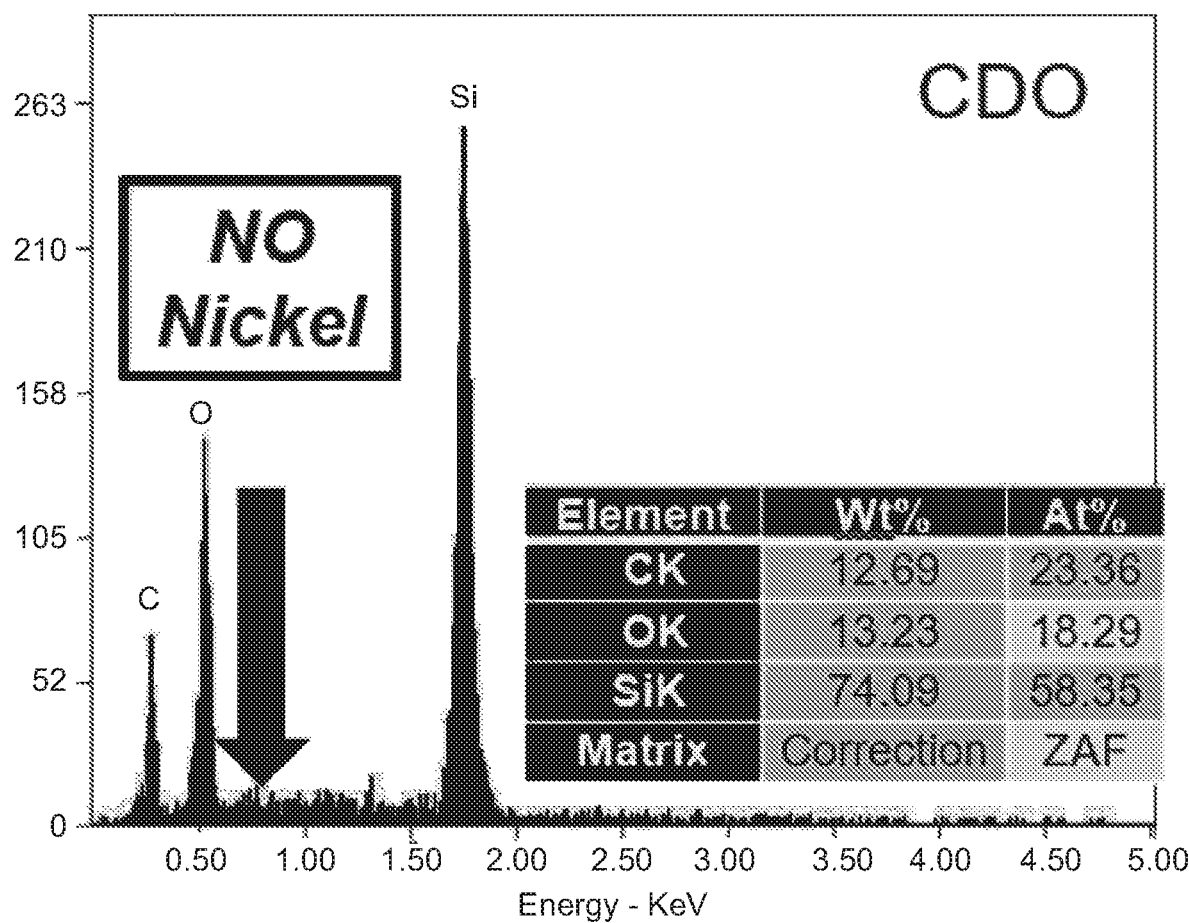
FIG. 24. EDS of a CDO substrate after 1000 deposition cycles at 180° C.

2.2.4 Description of Attempted Growth of Metallic Nickel on Non-Metallic Substrates The growth of metallic nickel was attempted on a variety of non-metallic substrates (Si(100), SiO$_2$, Si—H, and CDO) using Ni($^{tBu2}$DAD)$_2$ and tert-butyl amine as precursors. These experiments used a previously established saturative pulsing sequence of Ni($^{tBu2}$DAD)$_2$ (5.0 s), purge (10.0 s), tert-butyl amine (0.2 s), purge (10.0 s) for 50-1000 cycles. The absence of cobalt metal films on these substrates up to 1000 cycles was confirmed by cross-sectional SEM and EDS (FIG. 24).

The temperature dependence of the substrate-selective deposition of this process, the selectivity window, was explored. A series of 250-cycle depositions was carried out with saturative precursor doses, Ni($^{tBu2}$DAD)$_2$ (5.0 s), purge (10.0 s), tert-butyl amine (0.2 s), purge (10.0 s), at varying temperatures. Since applications for selective depositions will require ≤20 nm of nickel metal, and the observed growth rate for this process is 0.60 Å/cycle, a 250 cycle limit was imposed to provide relevant insight. The depositions were carried out from 160-220° C. None of the attempted deposition temperatures resulted in the deposition of nickel on any of the non-metallic substrates, and the absence of nickel metal films on these substrates was confirmed by cross-sectional SEM and EDS.

2.2.5 Trial Depositions for Nickel Metal Using Ni($^{tBu2}$DAD)$_2$ and Other Alkyl Amines The growth of metallic nickel was explored using diethyl amine and triethyl amine as a precursor alternative to tert-butyl amine. Films were grown using the pulsing sequence of Ni($^{tBu2}$DAD)$_2$ (5.0 s), purge (10.0 s), diethyl amine (0.2 s)/triethyl amine (0.2 s), purge (10.0 s) at a deposition temperature of 250° C., for 180 cycles. Nickel metal depositions on platinum substrates using diethyl amine and triethyl amine as a precursor resulted in no observable films (as confirmed by cross-sectional SEM). No further investigation was pursued.

2.3 Conclusions

The growth of nickel metal by low temperature thermal ALD from Ni($^{tBu2}$DAD)$_2$ and tert-butyl amine at 180° C. on various substrates was demonstrated. On platinum substrates, a linear growth rate of 0.60 Å/cycle from 50-1000 cycles was observed for plots of thickness as a function of the number of cycles. The y-intercept for this graph is within experimental error of zero, indicating no nucleation delay, with normal growth observed for as little as 3 nm of nickel on platinum substrates. Growth on ruthenium substrates showed a delay of 250 cycles before growth was observed, and is likely due to surface oxidation of the ruthenium substrate. Linear ALD growth of nickel metal on ruthenium and copper was not demonstrated, further depositions will be performed to determine if linear ALD growth occurs for this process on these substrates. Films of ~18 nm and ~60 nm thick nickel metal on platinum substrates were analyzed by AFM, with rms surface roughnesses of 0.45 nm (2.5% of total thickness), and 1.52 nm (2.5% of total thickness), respectively, which show that these films are smooth and continuous over a wide range of thicknesses. XPS analyses reveal that this process deposits high-purity nickel metal (>97%). Films grown on platinum and copper substrates showed low resistivities of ~22 μΩcm after 1000 cycles (~60 nm thick films). No film growth was observed after 1000 cycles on Si(100), Si—H, thermal SiO$_2$ and CDO substrates. Selective deposition of nickel metal on metallic substrates over non-metallic substrates occurs over a selectivity window of 160-220° C.

2.4 Experimental Section

A Picosun R-75BE ALD reactor was used for the thin film deposition experiments. Ultra-high purity nitrogen (99.999%, purchased from Airgas) was used as the carrier and purge gas for all depositions. The ALD reactor had a constant flow of the same ultra-high purity nitrogen in the deposition chamber for all depositions, with a pressure of 6-9 Torr. The low-temperature ALD of metallic nickel thin films was performed using Ni($^{tBu2}$DAD)$_2$ and tert-butyl amine as precursors. Ni($^{tBu2}$DAD)$_2$ was according to a literature procedure. (Knisley, T. J.; Saly, M. J.; Heeg, M. J.; Roberts, J. L.; Winter, C. H. *Organometallics* 2011, 30, 5010-5017). All alkyl amines used in depositions (tert-butyl amine, diethyl amine, and triethyl amine) were purchased from Sigma Aldrich. In initial growth trials, the source temperature for Ni($^{tBu2}$DAD)$_2$ was found to be optimum at 140° C. under the reactor pressure, and Ni($^{tBu2}$DAD)$_2$ was delivered by a Picosun solid state booster, while tert-butyl amine was delivered by a vapor-draw ampule at 20° C. Substrate temperatures were varied between 160 and 220° C. Film growth experiments used to assess selectivity were performed using the pulse sequence Ni($^{tBu2}$DAD)$_2$ (4.0 s)/N$_2$ purge (10.0 s)/tert-butyl amine (0.2 s)/N$_2$ purge (10.0 s) at 200° C. For the selectivity temperature window experiments, the same pulse and purge sequence was used, but the deposition temperatures were varied from 160-220° C. ALD growth studies were performed on Ru (13 nm)/TaN (2 nm)/SiO$_2$ (100 nm)/Si(100), Cu (33 nm)/TaN (7 nm)/SiO$_2$ (100 nm)/Si(100), Pt (10 nm)/SiO$_2$ (100 nm)/Si(100), Si(100) with native oxide, Si—H, thermal SiO$_2$ (100 nm)/Si(100), and CDO (~40 nm)/SiO$_2$ (100 nm)/Si(100) substrates. Si—H substrates were prepared by treating Si(100) with native oxide substrates with a 2% aqueous HF solution, followed by rinsing with deionized water and then drying with a stream of clean, dry air. The other substrates were used as received, except that they were rinsed sequentially with isopropanol and deionized water and then were dried with a stream of clean, dry air. One substrate of each kind, a 2×2 cm$^2$ coupon, was used in each experiment.

Film thicknesses were determined using cross-sectional SEM collected on a JEOL-6510LV electron microscope. The growth rates were determined by dividing the measured film thicknesses by the number of deposition cycles. Film thicknesses were measured at a minimum of three positions on each film to evaluate the uniformity. EDS was carried out on the JEOL-6510LV electron microscope using an Ametek EDAX system with Genesis Spectrum software. The accelerating voltage for the EDS measurements was 6 kV. AFM measurements were conducted using a Bruker BioScope Catalyst AFM using contact mode. XPS measurements were conducted using an Al Kα (1486.6 eV) X-ray source at a chamber base pressure of 10$^{-10}$ Torr. Spectra were recorded using a 16-channel detector with a hemispherical analyzer. Sputtering was performed using argon ions supplied by an argon sputter gun positioned at a 45° angle with respect to the substrate normal. Each sample was sputtered over a 2×2 mm$^2$ area and measured over a 0.8×0.8 mm$^2$ area. Nickel metal standards were sputtered with 5 keV argon ions. An uncoated platinum substrate (Pt (10 nm)/SiO$_2$ (100 nm)/Si (100)) was used as a standard for platinum and was sputtered with 3 keV argon ions. The ALD-grown cobalt films on platinum were sputtered with 3 keV argon ions. Sheet resistivity measurements were obtained using a Jandel 4-point probe in combination with a Keithley 2400 SourceMeter and a Keithley 2182A Nanovoltmeter. All films grown on metal substrates passed the Scotch tape test.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for depositing a coating on a surface of a substrate, the method comprising:

a) contacting the substrate with a vapor of a metal-containing compound having formula I to form a modified surface on the substrate:

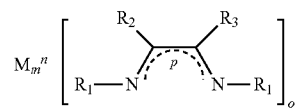

or radicals thereof;

wherein:

M is a transition metal, a group 1 metal, a group 2 metal, Zn, or Cd;

m is an integer;

n is the formal charge of M;

o is an integer such that the overall formal charge of the metal-containing compound having formula I is 0;

p is the formal charge of the ligand within the brackets;

R$_1$ is C$_{1-12}$ alkyl, amine, or C$_{6-18}$ aryl; and

R$_2$, R$_3$ are each independently H, C$_{1-10}$ alkyl, C$_{6-18}$ aryl, amino, C$_{1-12}$ alkylamino, or C$_{2-24}$ dialkylamino; and b) contacting the modified surface with a vapor of a Lewis base to form a metal coating on the substrate, the metal coating including metal atoms in the zero-oxidation state, wherein the Lewis base is selected from the group consisting of an alkyl amine, CO, R$_7$NC, P(R$_8$)$_3$, and P(OR$_9$)$_3$, where R$_7$, R$_8$, and R$_9$ are each independently H, C$_{1-6}$ alkyl or C$_{6-12}$ aryl.

2. The method of claim 1 wherein the Lewis base is an alkyl amine.

3. The method of claim 2 wherein the alkyl amine is described by the following formula:

wherein:

R$_5$ is H or a lower alkyl; and

R$_6$ is a lower alkyl.

4. The method of claim 1 wherein the Lewis base is selected from the group consisting of methyl amine, ethyl amine, n-propyl amine, isopropyl amine, n-butyl amine, sec-butyl amine, iso-butyl amine, tert-butyl amine, dimethyl amine, diethyl amine, di-n-propyl amine, di-iso-propyl amine, and the like.

5. The method of claim 1 wherein the Lewis base is CO, R$_7$NC, P(R$_8$)$_3$, or P(OR$_9$)$_3$.

6. The method of claim 1 wherein the metal-containing compound having formula I is thermally activated.

7. The method of claim 1 wherein the metal-containing compound having formula I is plasma activated.

8. The method of claim 1 wherein R$_2$, R$_3$ are each independently H or C$_{1-4}$ alkyl.

9. The method of claim 1 wherein R$_2$, R$_3$ are each independently H, methyl, ethyl, n-propyl, isopropyl, n-butyl, sec-butyl, isobutyl, or tert-butyl.

10. The method of claim 1 wherein R$^1$ is tert-butyl or isopropyl.

11. The method of claim 1 wherein n is 0, 1, 2, or 3;

m is 1; and o is 1, 2, or 3.

12. The method of claim 1 wherein molecular hydrogen is combined with the Lewis base prior to contacting the modified surface.

13. The method of claim 1 wherein M is Cu, Ni, Co, Cr, Mn, Fe, W, Mo, Ti, Zr, Hf, Rf, V, Nb, Ta, Re, Ru, Rh, Ir, Pd, Pt, Au, Li, Na, K, Rb, Cs, Mg, Ca, Sr, Ba, Zn, or Cd.

14. The method of claim 1 wherein M is Cr(II), Mn(II), Fe(II), Co(II), or Ni(II).

15. The method of claim 1 wherein the metal-containing compound is described by formulae III:

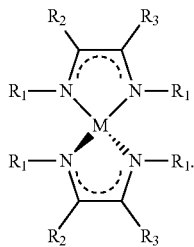

16. The method of claim 1 wherein the metal-containing compound is described by formulae IV:

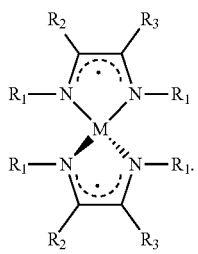

17. The method of claim 1 wherein $R_1$ is methyl, ethyl, n-propyl, isopropyl, n-butyl, sec-butyl, isobutyl, or tert-butyl.

18. A method comprising:
a) reacting a vapor of a metal-containing compound with a Lewis base to form a metal coating on a substrate, the metal coating including metal atoms in the zero-oxidation state, wherein the Lewis base is selected from the group consisting of an alkyl amine, CO, $R_7NC$, $P(R_8)_3$, and $P(OR_9)_3$, where $R_7$, $R_8$, and $R_9$ are each independently H, $C_{1-6}$ alkyl or $C_{6-12}$ aryl,
the metal-containing compound being described by formulae I:

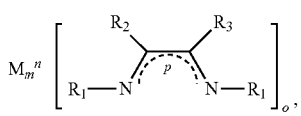

or radicals thereof;
wherein:
M is a transition metal, a group 1 metal, a group 2 metal, Zn, or Cd;
m is an integer;
n is the formal charge of M;

o is an integer such that the overall formal charge of the metal-containing compound having formula I is 0;
p is the formal charge of the ligand within the brackets;
$R_1$ is $C_{1-12}$ alkyl, amine, or $C_{6-18}$ aryl; and
$R_2$, $R_3$ are each independently H, $C_{1-10}$ alkyl, $C_{6-18}$ aryl, amino, $C_{1-12}$ alkylamino, or $C_{2-24}$ or dialkylamino.

19. The method of claim 18 wherein the Lewis base is an alkyl amine.

20. The method of claim 19 wherein the alkyl amine is described by the following formula:

wherein:
$R_5$ is H or a lower alkyl; and
$R_6$ is a lower alkyl.

21. The method of claim 18 wherein the Lewis base is selected from the group consisting of methyl amine, ethyl amine, n-propyl amine, isopropyl amine, n-butyl amine, sec-butyl amine, iso-butyl amine, tert-butyl amine, dimethyl amine, diethyl amine, di-n-propyl amine, di-iso-propyl amine, and the like.

22. The method of claim 18 wherein the Lewis base is CO, $R_7NC$, $P(R_8)_3$, or $P(OR_9)_3$.

23. The method of claim 18 wherein $R_2$, $R_3$ are each independently H or $C_{1-4}$ alkyl.

24. The method of claim 18 wherein $R_2$, $R_3$ are each independently H, methyl, ethyl, n-propyl, isopropyl, n-butyl, sec-butyl, isobutyl, or tert-butyl.

25. The method of claim 18 wherein $R^1$ is tert-butyl or isopropyl.

26. The method of claim 18 wherein
n is 0, 1, 2, or 3;
m is 1; and
o is 1, 2, or 3.

27. The method of claim 18 wherein molecular hydrogen is combined with the Lewis base and the metal-containing compound having formula 1.

28. The method of claim 18 wherein M is Cu, Ni, Co, Cr, Mn, Fe, W, Mo, Ti, Zr, Hf, Rf, V, Nb, Ta, Re, Ru, Rh, Ir, Pd, Pt, Au, Li, Na, K, Rb, Cs, Mg, Ca, Sr, Ba, Zn, or Cd.

29. The method of claim 18 wherein M is Cr(II), Mn(II), Fe(II), Co(II), or Ni(II).

30. The method of claim 18 wherein the metal-containing compound is described by formulae II:

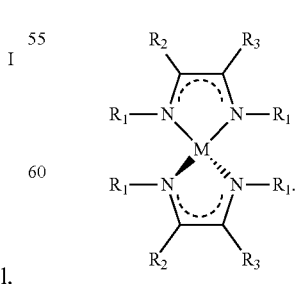

31. The method of claim 18 wherein the metal-containing compound is described by formulae IV:

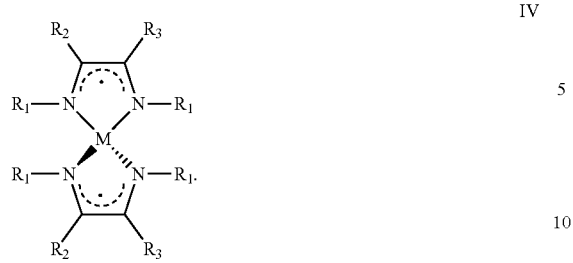
IV
32. The method of claim 18 wherein $R_1$ is methyl, ethyl, n-propyl, isopropyl, n-butyl, sec-butyl, isobutyl, or tert-butyl.
* * * * *